(12) United States Patent
Shin et al.

(10) Patent No.: US 12,063,831 B2
(45) Date of Patent: Aug. 13, 2024

(54) ELECTRONIC DEVICE INCLUDING UNDER DISPLAY CAMERA

(71) Applicant: SAMSUNG ELECTRONICS CO., LTD., Suwon-si (KR)

(72) Inventors: Sungyoung Shin, Suwon-si (KR);
Minsuk Uhm, Suwon-si (KR);
Dongseop Lee, Suwon-si (KR);
Haechang Lee, Suwon-si (KR);
Kwangtai Kim, Suwon-si (KR);
Donghyun Yeom, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/298,599

(22) Filed: Apr. 11, 2023

(65) Prior Publication Data

US 2023/0345779 A1 Oct. 26, 2023

Related U.S. Application Data

(63) Continuation of application No. PCT/KR2023/004389, filed on Mar. 31, 2023.

(30) Foreign Application Priority Data

Apr. 20, 2022 (KR) .......................... 10-2022-0049076

(51) Int. Cl.
*H01L 27/32* (2006.01)
*G09G 3/3208* (2016.01)
(Continued)

(52) U.S. Cl.
CPC ......... *H10K 59/131* (2023.02); *G09G 3/3208* (2013.01); *H10K 59/1213* (2023.02);
(Continued)

(58) Field of Classification Search
CPC .................................................... G06F 3/0412
See application file for complete search history.

(56) References Cited

U.S. PATENT DOCUMENTS

| | | | |
|---|---|---|---|
| 2013/0155024 A1* | 6/2013 | Chung | G06F 3/0412 345/175 |
| 2020/0258967 A1 | 8/2020 | Kim et al. | |

(Continued)

FOREIGN PATENT DOCUMENTS

| | | |
|---|---|---|
| CN | 112259602 | 1/2021 |
| JP | 2022-021645 | 2/2022 |

(Continued)

OTHER PUBLICATIONS

Search Report and Written Opinion dated Jul. 10, 2023 issued in International Patent Application No. PCT/KR2023/004389.

*Primary Examiner* — Nan-Ying Yang
(74) *Attorney, Agent, or Firm* — NIXON & VANDERHYE P.C.

(57) ABSTRACT

Various embodiments of the disclosure relate to an electronic device including an under display camera (UDC). The electronic device includes: a housing, a display, and a camera disposed inside the housing overlapping a portion of the display and acquiring light passing through the display from outside. The display includes a first area in which a first pixel overlapping with at least a portion of the camera and a first pixel driving circuit for driving the first pixel are disposed, and a second area, other than the first area, in which a second pixel and a second pixel driving circuit for driving the second pixel are disposed. The first pixel driving circuit includes a first driving thin film transistor (TFT) having a first channel region having a straight shape does not include a curved shape, and the second pixel driving circuit includes a second driving TFT having a second channel region of a curved shape. A first channel width of the first (Continued)

driving TFT is greater than a second channel width of the second driving TFT, and a first channel length of the first driving TFT is less than a second channel length of the second driving TFT.

20 Claims, 22 Drawing Sheets

(51) Int. Cl.
    *H01L 51/00*     (2006.01)
    *H01L 51/56*     (2006.01)
    *H10K 59/121*     (2023.01)
    *H10K 59/131*     (2023.01)

(52) U.S. Cl.
    CPC .............. *G09G 2300/0426* (2013.01); *G09G 2320/0233* (2013.01); *G09G 2320/043* (2013.01)

(56) References Cited

U.S. PATENT DOCUMENTS

| | | | |
|---|---|---|---|
| 2020/0273927 A1* | 8/2020 | Oh | ........................ H10K 59/121 |
| 2020/0312926 A1 | 10/2020 | Bae et al. | |
| 2020/0381495 A1 | 12/2020 | Jeon et al. | |
| 2021/0036070 A1 | 2/2021 | Jeon et al. | |
| 2021/0143231 A1 | 5/2021 | Chae et al. | |
| 2021/0376008 A1 | 12/2021 | Tan | |
| 2021/0408151 A1 | 12/2021 | Choi et al. | |
| 2022/0028335 A1 | 1/2022 | Matsueda et al. | |
| 2022/0109036 A1 | 4/2022 | Jeong et al. | |

FOREIGN PATENT DOCUMENTS

| | | |
|---|---|---|
| KR | 20200097371 A | 8/2020 |
| KR | 20200115888 A | 10/2020 |
| KR | 20200136549 A | 12/2020 |
| KR | 20210016161 A | 2/2021 |
| KR | 20210059091 A | 5/2021 |
| KR | 10-2022-0001805 | 1/2022 |
| KR | 10-2022-0045756 | 4/2022 |

\* cited by examiner

ELECTRONIC DEVICE INCLUDING UNDER DISPLAY CAMERA

CROSS-REFERENCE TO RELATED APPLICATIONS

This application is a continuation of International Application No. PCT/KR2023/004389 designating the United States, filed on Mar. 31, 2023, in the Korean Intellectual Property Receiving Office and claiming priority to Korean Patent Application No. 10-2022-0049076, filed on Apr. 20, 2022, in the Korean Intellectual Property Office, the disclosures of which are incorporated by reference herein in their entireties.

BACKGROUND

Field

The disclosure relates to an electronic device including an under display camera (UDC).

Description of Related Art

Electronic devices, for example, portable electronic devices, are released in various sizes depending on their functions and user preferences and may include a large screen touch display for wide visibility and convenience of manipulation. An electronic device may include at least one camera. For example, the electronic device may include at least one camera disposed around a display or overlapping with at least a portion of the display.

The above information is presented as background information only to assist with an understanding of the disclosure. No determination has been made, and no assertion is made, as to whether any of the above might be applicable as prior art with regard to the disclosure.

Recently, as a solution for expanding the display area of a display in an electronic device, under display camera (UDC) technology for arranging a camera around (e.g., under) an active area of the display is being researched and developed. For example, an electronic device in which the UDC is disposed under the active area of the display needs to increase transmittance in at least a portion (hereinafter referred to as "UDC area") of the display overlapping with the UDC in order to increase the amount of light introduced into the UDC. To this end, a method of forming, in the UDC area, a transmission area in which no pixels and/or lines are formed by lowering the arrangement density of pixels and/or lines of the display may be proposed. For example, a plurality of first pixels in the UDC area may be disposed to have a first density, and a plurality of second pixels in a normal area (e.g., an area not overlapping with the UDC) other than the UDC area may be disposed to have a second density higher than the first density.

An electronic device including a UDC may require a technique for reducing a visibility problem that a UDC area is recognized by a user due to a decrease in the arrangement density of a plurality of first pixels disposed in the UDC area.

Because a luminance difference between a UDC area and a normal area may occur due to a decrease in the arrangement density of a plurality of first pixels disposed in the UDC area, an electronic device including a UDC may require a technique for reducing the luminance difference.

An electronic device including a UDC may require a design for reducing not only a luminance difference between a UDC area and a normal area, but also a difference between the lifespans of second pixels disposed in the normal area and the lifespans of first pixels disposed in the UDC area.

SUMMARY

Embodiments of the disclosure may provide an electronic device capable of increasing the transmittance of a UDC area and reducing a luminance difference and/or lifetime difference between first pixels disposed in the UDC area and second pixels disposed in a normal area, by changing the structure of the first pixel disposed in the UDC area and/or the shape of a driving circuit for driving the first pixel.

Embodiments of the disclosure may provide an electronic device capable of reducing a visibility problem in which a UDC area is viewed by a user, by changing the structure of a first pixel disposed in the UDC area.

The technical problems to be addressed in the disclosure are not limited to the above-mentioned technical problems, and those of ordinary skill in the art to which the disclosure pertains will clearly understand, from the following description, other technical problems not mentioned herein.

An electronic device according to various example embodiments includes: a housing; a display; and a camera disposed inside the housing overlapping a portion of the display and configured to acquire light passing through the display from outside, wherein the display includes a first area in which a first pixel overlapping with at least a portion of the camera and a first pixel driving circuit for driving the first pixel are disposed, and a second area, other than the first area, in which a second pixel and a second pixel driving circuit for driving the second pixel are disposed, wherein the first pixel driving circuit includes: a first driving thin film transistor (TFT) having a first channel region having a straight shape that does not include a curved shape, wherein the second pixel driving circuit includes: a second driving TFT having a second channel region having a curved shape, wherein a first channel width of the first driving TFT is greater than a second channel width of the second driving TFT, and wherein a first channel length of the first driving TFT is less than a second channel length of the second driving TFT.

An electronic device according to various example embodiments of the disclosure can increase the transmittance of a UDC area and reduce a luminance difference and/or lifetime difference between first pixels disposed in the UDC area and second pixels disposed in a normal area, by changing the structure of the first pixel disposed in the UDC area and/or the shape of a driving circuit for driving the first pixel.

An electronic device according to various example embodiments of the disclosure can reduce a visibility problem in which a UDC area is viewed by a user, by changing the structure of a first pixel disposed in the UDC area.

In addition, various effects explicitly or implicitly appreciated through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

Throughout the disclosure and drawings, it will be understood that like reference numbers refer to like parts, components, and structures.

DETAILED DESCRIPTION

The following description is made with reference to the accompanying drawings and is provided to facilitate a comprehensive understanding of various example embodiments of the disclosure. It contains various specific details for illustrative purposes, but these should be regarded as illustrative only. Accordingly, those skilled in the art will recognize that various changes and modifications may be made to the various example embodiments described herein without departing from the scope of the disclosure. Also, descriptions of well-known functions and configurations may be omitted for clarity and conciseness.

The terms and words used in the following description and claims are not limited to their bibliographic meaning, and are used to enable a clear and consistent understanding of the disclosure. Accordingly, it should be apparent to those skilled in the art that the following description of various example embodiments of the disclosure is provided for purposes of illustration only and not limitation of the disclosure.

Singular forms of expressions are to be understood as including plural referents unless the context clearly dictates otherwise. Thus, for example, reference to "a component surface" may include reference to one or more of such surfaces.

Figure 1:
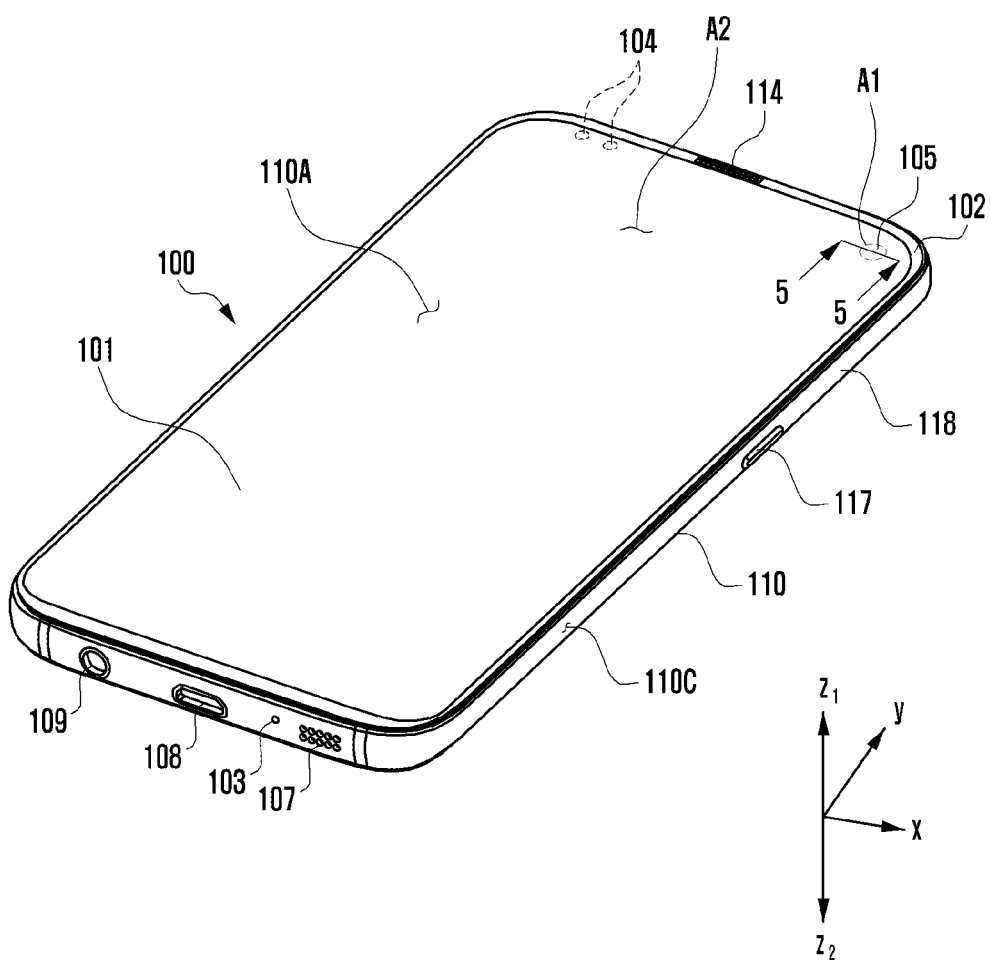
FIG. 1 is a front perspective view of an electronic device according to various embodiments.
Figure 2:
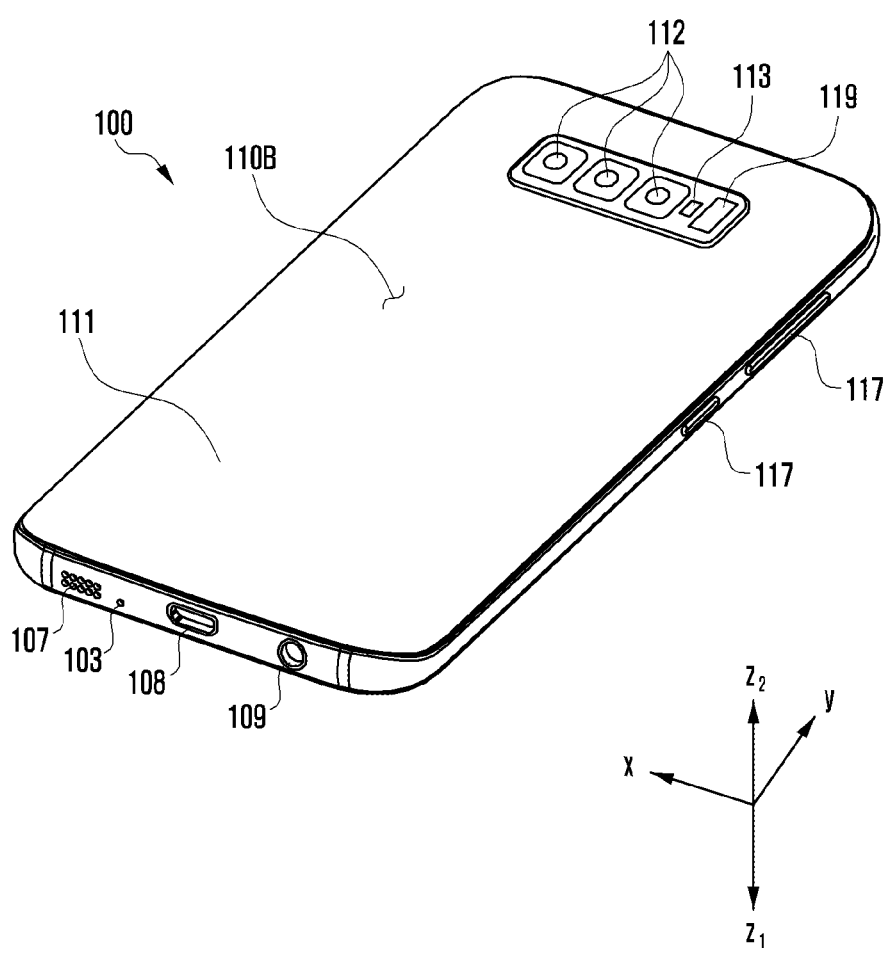
FIG. 2 is a rear perspective view of the electronic device of FIG. 1 according to various embodiments.

FIG. 1 is a front perspective view of an electronic device 100 according to various embodiments. FIG. 2 is a rear perspective view of the electronic device 100 of FIG. 1 according to various embodiments.

With reference to FIGS. 1 and 2, the electronic device 100 according to an embodiment may include a housing 110 having a first surface (or a front surface) 110A, a second surface (or a rear surface) 110B, and a side surface 110C surrounding a space between the first surface 110A and the second surface 110B. In an embodiment (not shown), the housing 110 may refer to a structure that forms some of the first surface 110A, the second surface 110B, and the side surface 110C. According to an embodiment, the first surface 110A may be formed by a front plate 102 (e.g., a glass plate including various coating layers, or a polymer plate) that is substantially transparent at least in part. The second surface 110B may be formed by a substantially opaque rear plate 111. The rear plate 111 may be formed, for example, of coated or colored glass, ceramic, polymer, metal (e.g., aluminum, stainless steel (STS), or magnesium), or a combination of at least two of the foregoing materials. The side surface 110C may be combined with the front plate 102 and the rear plate 111 and formed by a lateral bezel structure 118 (or "lateral member") including metal and/or polymer. In various embodiments, the rear surface plate 111 and the lateral bezel structure 118 may be integrally formed and include the same material (e.g., a metal material such as aluminum).

According to an embodiment, the electronic device 100 may include at least one of a display 101, an input device 103, sound output devices 107 and 114, sensor modules 104 and 119, cameras 105 and 112, a key input device 117, an indicator (not shown), and connectors 108 and 109. In various embodiments, the electronic device 100 may omit at least one (e.g., the key input device 117, the connectors 108 and 109, or the indicator) of the above components or additionally include other components.

According to an embodiment, the display 101 may be visible through a portion of the front plate 102, for example. In various embodiments, at least a portion of the display 101 may be viewed through the front plate 102 forming the first surface 110A. In various embodiments, the edge of the display 101 may be substantially identical to an adjacent outer shape of the front plate 102. In an embodiment (not shown), in order to expand the area where the display 101 is visible (as used herein with reference to the display, the terms "exposed", "visible", "visually exposed", etc. may be used interchangeably and include a display having a cover layer, cover sheet, cover plate, or the like), a distance between the periphery of the display 101 and the periphery of the front plate 102 may be substantially unchanged.

According to an embodiment, the surface (or the front plate 102) of the housing 110 may include a screen display area formed as the display 101 is visually exposed (e.g., visible). According to an embodiment, the screen display area may include a camera overlapping area A1 (e.g., a first area) in which the first camera 105 is disposed below (e.g., in the z2 direction), and a normal display area A2 (e.g., a second area) where no camera is disposed below (e.g., in the z2 direction). According to an embodiment, the screen display area may further include a sensor overlapping area (not shown) in which at least one sensor module (not shown) is disposed below (e.g., in the z2 direction). For example, the at least one sensor module may be a sensor of various types that operates by acquiring external light.

According to an embodiment, the cameras 105 and 112 may include the first camera 105 disposed on the first surface 110A of the electronic device 100 and/or the second camera 112 disposed on the second surface 110B. The cameras 105 and 112 may include one or more lenses, an image sensor, and/or an image signal processor. The cameras 105 and 112 may further include a flash 113. In various embodiments, two or more lenses (wide-angle lens, ultra-wide-angle lens, or telephoto lens) and image sensors may be disposed on the first surface 110A or the second surface 110B of the electronic device 100. In an embodiment, the electronic device 100 may include a plurality of cameras 105 and 112. For example, the electronic device 100 may include a plurality of cameras (e.g., a dual camera or a triple camera) having different properties (e.g., angle of view) or functions. For example, there may be the plurality of cameras 105 and 112 including lenses with different angles of view, and the electronic device 100 may control the angles of view of the cameras 105 and 112 to be changed in response to a user's selection. In addition, the plurality of cameras 105 and 112 may include at least one of a wide-angle camera, a telephoto camera, a color camera, a monochrome camera, or an infrared (IR) camera (e.g., a time of flight (TOF) camera, a structured light camera). According to an embodiment, the IR camera may operate as at least a part of the sensor module.

According to an embodiment, the first camera 105 may be disposed under (e.g., in the z2 direction) the camera overlapping area A1 of the display. The first camera 105 may be referred to as an under display camera (UDC). For example, because the first camera 105 is disposed under (e.g., in the z2 direction) the camera overlapping area A1 of the display, the position of the first camera 105 may not be visually distinguished (or exposed). According to an embodiment, when the display 101 is viewed from above (e.g., the z1 direction), the first camera 105 is disposed in the camera overlapping area A1, which is a part of the display, not to be visually exposed to the outside, and it can acquire an image of an external subject. For example, when the display 101 is viewed from above (e.g., the z1 direction), the first camera 105 may be disposed to overlap with at least a part of the camera overlapping area A1 and not to be visually exposed, thus acquiring an image of an external subject.

According to an embodiment, a recess or an opening may be formed in a portion of a screen display area (e.g., the first surface 110A or the first area 110D) of the display 101, and at least one of the sound output device 114, the sensor module 104, a light emitting device (e.g., the flash), and the camera 105 may be included to be aligned at least in part with the recess or the opening. In an embodiment, at least one of the sound output device 114, the sensor module 119, the light emitting device (e.g., the flash), and the camera 112 may be included under the screen display area of the display 101.

According to an embodiment, the display 101 may be disposed to be combined with or adjacent to a touch sensing circuit, a pressure sensor capable of measuring the intensity (pressure) of a touch, and/or a digitizer for detecting a magnetic stylus pen.

According to an embodiment, the input device 103 may include a microphone 103. In various embodiments, the input device 103 may include a plurality of microphones 103 disposed to detect the direction of sound. The sound output devices 107 and 114 may include speakers 107 and 114. The speakers 107 and 114 may include an external speaker 107 and a call receiver 114. In various embodiments, the microphone 103, the speakers 107 and 114, and the connectors 108 and 109 may be disposed in the space of the electronic device 100 and exposed to the external environment through at least one hole formed in the housing 110. In various embodiments, the hole formed in the housing 110 may be commonly used for the microphone 103 and the speakers 107 and 114. In various embodiments, the sound output devices 107 and 114 may include a speaker (e.g., a piezo speaker) that operates without any hole formed in the housing 110.

According to an embodiment, the sensor modules 104 and 119 may generate electrical signals or data values corresponding to an internal operating state of the electronic device 100 or an external environmental state. The sensor modules 104 and 119 may include, for example, a first sensor module 104 (e.g., a proximity sensor) and/or a second sensor module (not shown) (e.g., a fingerprint sensor) disposed on the first surface 110A of the housing 110, and/or a third sensor module 119 (e.g., an HRM sensor) disposed on the second surface 110B of the housing 110. The fingerprint sensor may be disposed under the first surface 110A of the housing 110, a portion of the second surface 110B, or the display 101. The electronic device 100 may further include a sensor module (not shown), for example, at least one of a gesture sensor, a gyro sensor, an air pressure sensor, a magnetic sensor, an acceleration sensor, a grip sensor, a color sensor, an infrared (IR) sensor, a bio sensor, a temperature sensor, a humidity sensor, or an illuminance sensor. According to various embodiments, the electronic device 100 may have a bar-type or plate-type appearance, but the disclosure is not limited thereto. For example, the electronic device 100 may include various forms of electronic devices such as a foldable electronic device, a slidable electronic device, a stretchable electronic device, and/or a rollable electronic device.

Figure 3:
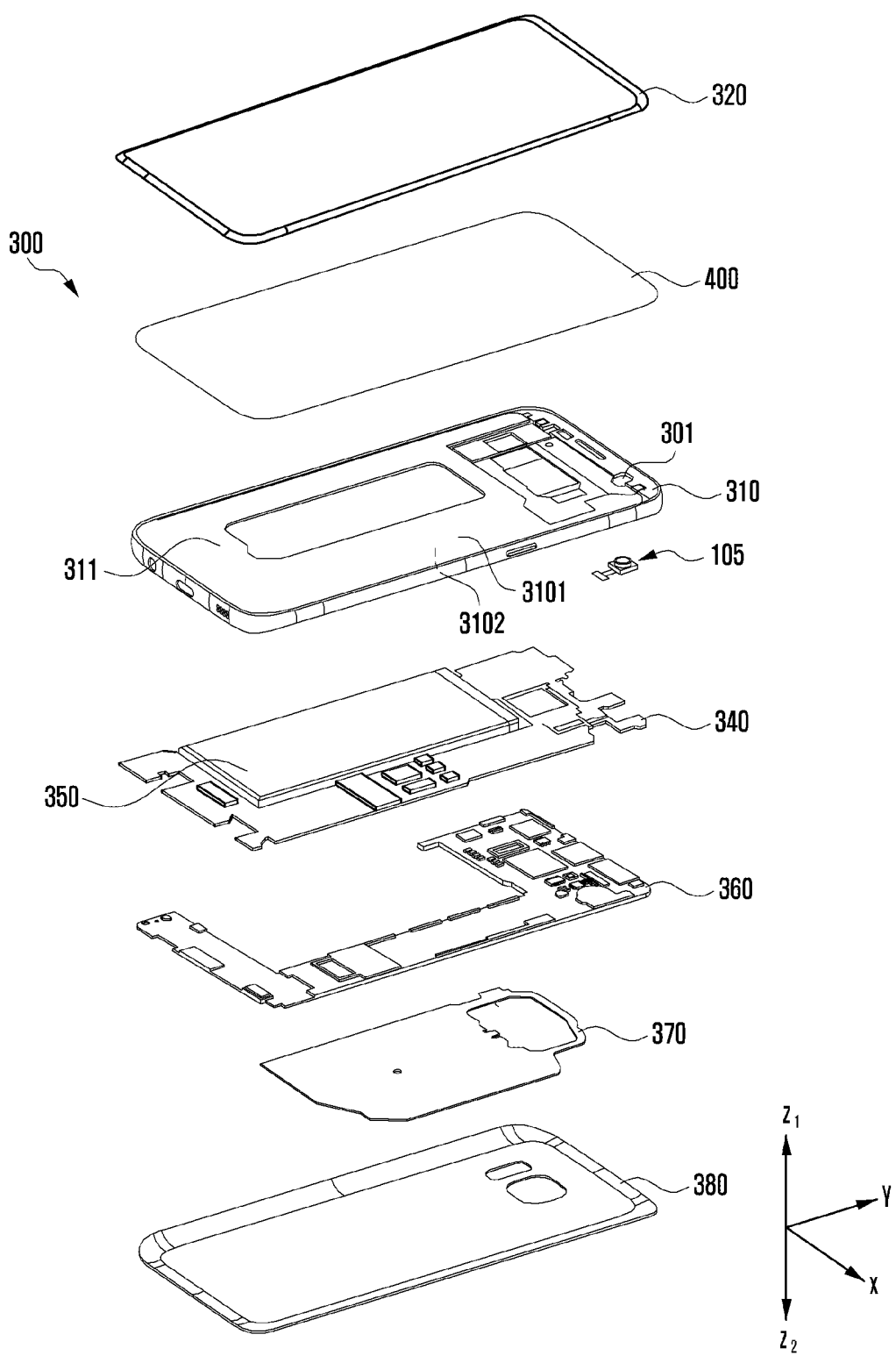
FIG. 3 is an exploded perspective view of the electronic device of FIG. 1 according to various embodiments.

FIG. 3 is an exploded perspective view of the electronic device 100 of FIG. 1 according to various embodiments.

The electronic device 300 of FIG. 3 may be similar at least in part to the electronic device 100 of FIGS. 1 and 2 or further include various embodiments of the electronic device.

With reference to FIG. 3, an electronic device 300 (e.g., the electronic device 100 in FIG. 1 or 2) may include a lateral member 310 (e.g., the lateral bezel structure 118 in FIG. 1), a first support member 311 (e.g., a bracket or support structure), a front plate 320 (e.g., a front cover, the front plate 102 in FIG. 1), a display 400 (e.g., the display 101 in FIG. 1), a printed circuit board 340 (e.g., a printed circuit board (PCB), a flexible PCB (FPCB), or a rigid flexible PCB (RFPCB)), a battery 350, a second support member 360 (e.g., rear case), an antenna 370, and a rear plate 380 (e.g., a rear cover, the rear plate 111 in FIG. 2). In various embodiments, the electronic device 300 may omit at least one (e.g., the first support member 311 or the second support member 360) of the above components or additionally include other components. At least one of the components of the electronic device 300 may be identical to or similar to at least one of the components of the electronic device 100 in FIG. 1 or 2, and thus overlapping descriptions may not be repeated hereinafter.

According to an embodiment, the first support member 311 may be disposed inside the electronic device 300 and connected to the lateral member 310 or integrally formed with the lateral member 310. The first support member 311 may be formed of, for example, a metal material and/or a non-metal (e.g., polymer) material. The first support member 311 may be combined with the display 400 on one surface thereof and combined with the printed circuit board 340 on the other surface.

According to an embodiment, a processor, a memory, and/or an interface may be mounted on the printed circuit board 340. The processor may include, for example, one or more of a central processing unit, an application processor, a graphics processing unit, an image signal processor, a sensor hub processor, or a communication processor.

According to an embodiment, the memory may include, for example, a volatile memory or a non-volatile memory.

According to an embodiment, the interface may include, for example, a high definition multimedia interface (HDMI), a universal serial bus (USB) interface, an SD card interface, and/or an audio interface. The interface may electrically or physically connect the electronic device 300 to an external electronic device, and may include a USB connector, an SD card/MMC connector, or an audio connector.

According to an embodiment, the battery 350 is a device for supplying power to at least one component of the electronic device 300 and may include, for example, a non-rechargeable primary battery, a rechargeable secondary battery, or a fuel cell. At least a portion of the battery 350 may be disposed, for example, substantially on the same plane as the printed circuit board 340. The battery 350 may be integrally disposed inside the electronic device 300. In an embodiment, the battery 350 may be detachably disposed in the electronic device 300.

According to an embodiment, the antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, perform short-range communication with an external device or wirelessly transmit/receive power required for charging. In an embodiment, an antenna structure may be formed by a part of the lateral bezel structure 310 and/or a part of the first support member 311 or a combination thereof.

According to an embodiment, the second support member 360 (e.g., a rear case) may be disposed between the printed circuit board 340 and the antenna 370. According to an embodiment, the second support member 360 may have one surface where at least one of the printed circuit board 340 or the battery 350 is combined, and the other surface where the antenna 370 is combined.

According to an embodiment, the first support member 311 of the lateral member 310 may have a first surface 3101 facing the front surface plate 320 and a second surface 3102 facing a direction (e.g., the direction of the rear surface plate 380) opposite to the first surface 3101. According to an embodiment, the camera 105 (e.g., the first camera 105 in FIG. 1) may be disposed between the first support member 311 and the rear plate 380. According to an embodiment, the camera 105 may be disposed to be protruded or visible in the direction of the front surface plate 320 through a through-hole 301 connected from the first surface 3101 to the second surface 3102 of the first support member 311. According to an embodiment, a portion protruding through the through-hole 301 of the camera 105 may be disposed to detect an external environment at a corresponding position of the display 400. In an embodiment, when the camera 105 is disposed between the display 400 and the first support member 311, the through-hole 301 may be unnecessary.

Hereinafter, in the electronic device 300, the arrangement relationship of the display 400 and the camera 105 will be described in detail.

Figure 4:
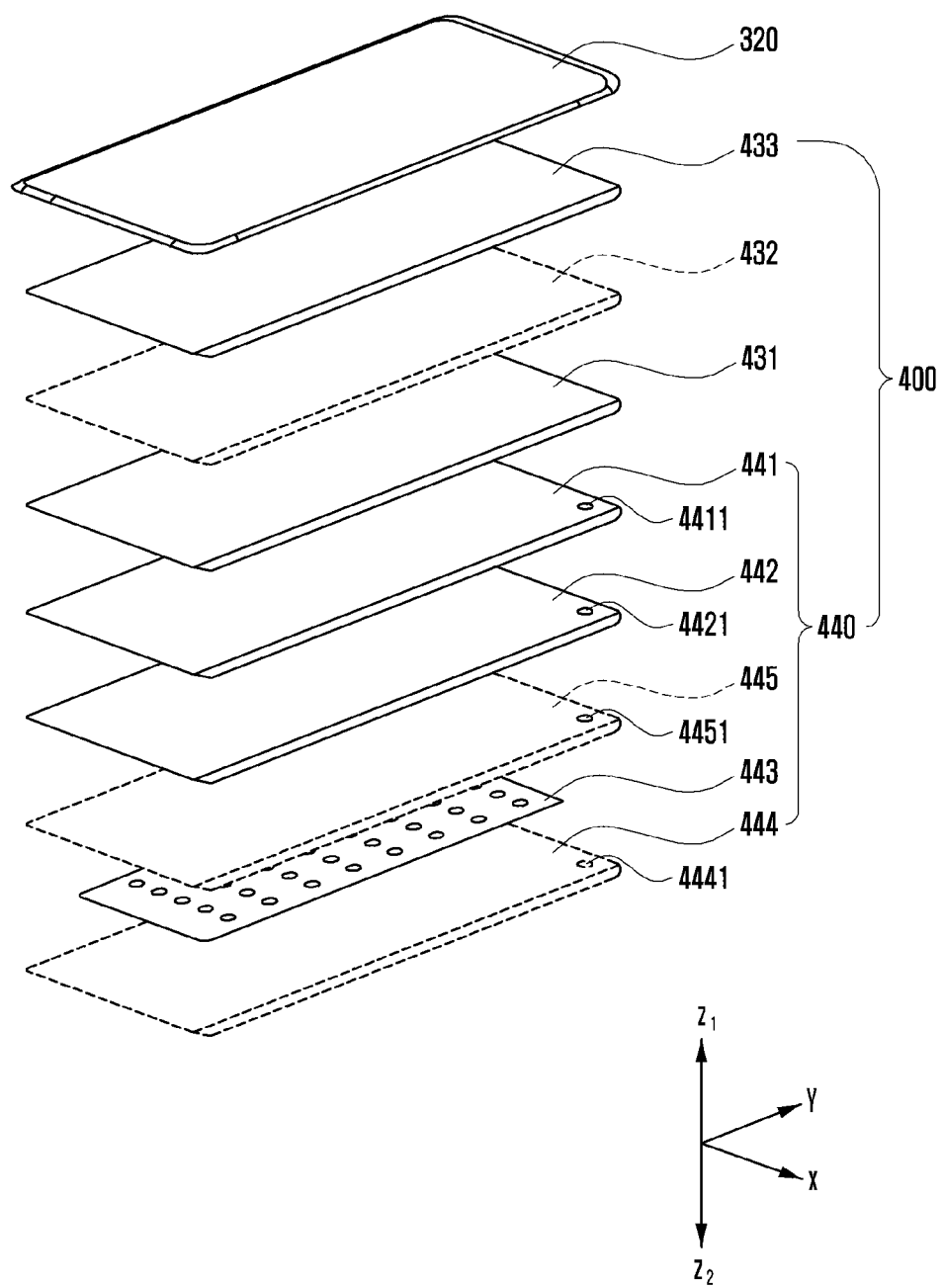
FIG. 4 is an exploded perspective view of the display shown in FIG. 3 according to various embodiments.

FIG. 4 is an exploded perspective view of the display 400 shown in FIG. 3 according to various embodiments.

The display 400 of FIG. 4 may be similar at least in part to the display 101 of FIG. 1 and the display 400 of FIG. 3 or further include various embodiments of the display.

With reference to FIG. 4, the display 400 according to an embodiment may include a display panel 431, a color filter layer 433 formed in a first direction (e.g., the z1 direction) from the display panel 431, a touch panel 432 formed between the color filter layer 433 and the display panel 431, and/or an subsidiary material layer 440 formed in a second direction (e.g., the z2 direction) from the display panel 431. In an embodiment, the touch panel 432 may be formed in the first direction from the color filter layer 433.

According to an embodiment, the display panel 431 may include organic light emitting diodes (OLED). For example, it may include an unbreakable (UB) type OLED display (e.g., curved display). According to an embodiment, the display panel 431 may have a first pixel (e.g., the first pixel R1 in FIG. 6) representing a first color (e.g., red), a second pixel (e.g., the second pixel G1 in FIG. 6) representing a second color (e.g., green), and/or a third pixel (e.g., third pixel B1 in FIG. 6) representing a third color (e.g., blue). According to an embodiment, the first to third pixels may be arranged side by side in accordance with a designated rule. For example, the first to third pixels may be arranged parallel to each other on the x-y plane shown in FIG. 4. According to various embodiments, the display panel 431 is not limited to including pixels of three colors and may include pixels of much more colors. For example, the display panel 431 may have pixels of three or more colors. According to various embodiments, a method of arranging pixels of the display panel 431 may be variously modified or changed. According to various embodiments, the area or shape of pixels of the display panel 431 may be variously modified or changed.

According to an embodiment, the display 400 may not include a polarizer (POL) (e.g., a circular polarizer or retarder) and may include the color filter layer 433 in a color filter on encapsulation (COE) scheme. According to an example embodiment, the display 400 may increase transmittance and reduce thickness by including no polarizer (POL). For example, compared to a conventional display having the POL, the display 400 with no POL according to an embodiment may achieve the transmittance improved by about 20% or more and the thickness reduced by about 100 µm to about 150 µm. According to an embodiment, the color filter layer 433 may perform the same or similar function as a POL applied in a display including organic light emitting diodes (OLED). For example, the color filter layer 433 may improve outdoor visibility by blocking reflected light from the display panel 431.

According to an embodiment, the subsidiary material layer 440 may include one or more polymer members 441 and 442 disposed on a rear surface (e.g., a surface facing the second direction (the z2 direction)) of the display panel 431, at least one functional member 443 disposed on a rear surface (e.g., a surface facing the second direction (the z2 direction)) of the one or more polymer members 441 and 442, and a metal sheet 444 disposed on a rear surface (e.g., a surface facing the second direction (the z2 direction)) of the at least one functional member 443.

According to an embodiment, the one or more polymer members 441 and 442 may include a light-blocking layer 441 (e.g., a black layer including an rugged pattern) for removing air bubbles that generated between the display panel 431 and its underneath attachments (e.g., in the second direction (the z2 direction)) and blocking light generated by the display panel 431 or incident light from the outside, and/or a buffer layer 442 (e.g., a sponge layer) disposed to mitigate impact. According to an embodiment, the buffer layer 442 may include a cushion member formed of a polymer.

According to an embodiment, the at least one functional member 443 may include a heat dissipation sheet (e.g., a graphite sheet) for heat dissipation, a force touch FPCB, a fingerprint sensor FPCB, an antenna radiator for communication, a conductive/non-conductive tape, or an open cell sponge.

According to an embodiment, the metal sheet 444 is a conductive member (e.g., a metal plate) and may help reinforce the rigidity of the electronic device (e.g., the electronic device 300 in FIG. 3), shield ambient noise, and may be used to dissipate heat emitted from surrounding heat dissipating components. According to an embodiment, the metal sheet 444 may include at least one of Cu, Al, Mg, steel use stainless (SUS) (e.g., stainless steel (STS)), or CLAD (e.g., a laminated member in which SUS and Al are alternately disposed). In various embodiments, the metal sheet 444 may include other alloy materials.

According to an embodiment, the subsidiary material layer 440 of the display 400 may further include a detection member 445 for detecting an input by a writing member (e.g., an electronic pen) of an electromagnetic induction scheme. According to an embodiment, the detection member 445 is a digitizer and may include a coil member disposed on a dielectric substrate so as to detect a resonant frequency of an electromagnetic induction scheme applied from the electronic pen. In various embodiments, the detection member 445 may be omitted. According to an embodiment, the detection member 445 may be disposed between the at least one polymer member 442 and the functional member 443. In an embodiment, the detection member 445 may be disposed between the display panel 431 and the one or more polymer members 441 and 442. In an embodiment, the detection member 445 may be disposed below the metal sheet 444.

According to various embodiments, the subsidiary material layer 440 may have openings 4411, 4421, 4451, and 4441 formed at positions overlapping with the camera (e.g., the camera 105 in FIG. 3). According to an embodiment, the openings 4411, 4421, 4451, and 4441 may be formed by removing a portion of the subsidiary material layer 440 overlapping with the camera 105. According to an embodiment, the camera 105 may be disposed to be close to the rear surface (e.g., the surface facing the second direction (the z2 direction)) of the display panel 431 through the openings 4411, 4421, 4451, and 4441. According to an embodiment, the size (e.g., diameter, area) of the plurality of openings 4411, 4421, 4451, and 4441 may be formed based on the size of the camera 105 and/or the angle of view of the camera 105. The openings 4411, 4421, 4451, and 4441 may have different sizes.

According to an embodiment, the front cover 320 (e.g., a front plate, a glass plate, a first cover member, or a cover member) may be formed in the first direction from the display 400. According to an embodiment, the front cover 320 may include a glass layer. For example, the front cover 320 may include ultra-thin glass (UTG). In various embodiments, the front cover 320 may include a polymer. For example, the front cover 320 may include polyethylene terephthalate (PET) or polyimide (PI). In various embodiments, a plurality of front covers 320 may be disposed. In various embodiments, one layer of the plurality of front covers 320 may be disposed by an adhesive having weaker adhesive strength or a thinner thickness than adhesives of the other layers so that it can be well separated from the other layer. According to an embodiment, the adhesive may include an optical clear adhesive (OCA), a pressure sensitive adhesive (PSA), a heat reactive adhesive, a photo-reactive adhesive, a normal adhesive, and/or a double-sided tape.

According to an embodiment, the display 400 may not include at least one of the touch panel 432, the detection member 445, and/or the metal sheet 444.

According to an embodiment, the display 400 may include a control module (not shown). According to an embodiment, the control module may include an FPCB electrically connecting the printed circuit board (e.g., the printed circuit board 340 in FIG. 3) and the display panel 431 of the electronic device (e.g., the electronic device 300 in FIG. 3), and a display driver IC (DDI) mounted on the FPCB. According to an embodiment, the control module (not shown) may include a display driver IC (DDI) and/or a touch display driver IC (TDDI) disposed in a chip on panel (COP) or chip on film (COF) scheme.

In an embodiment, the display 400 may include a fingerprint sensor (not shown) disposed around the control module. According to an embodiment, the fingerprint sensor may include an ultrasonic or optical fingerprint sensor capable of recognizing a fingerprint of a finger contacted or approached from the outer surface of the front cover 320 through a hole at least partially formed in some of the components of the display 400.

Figure 5:
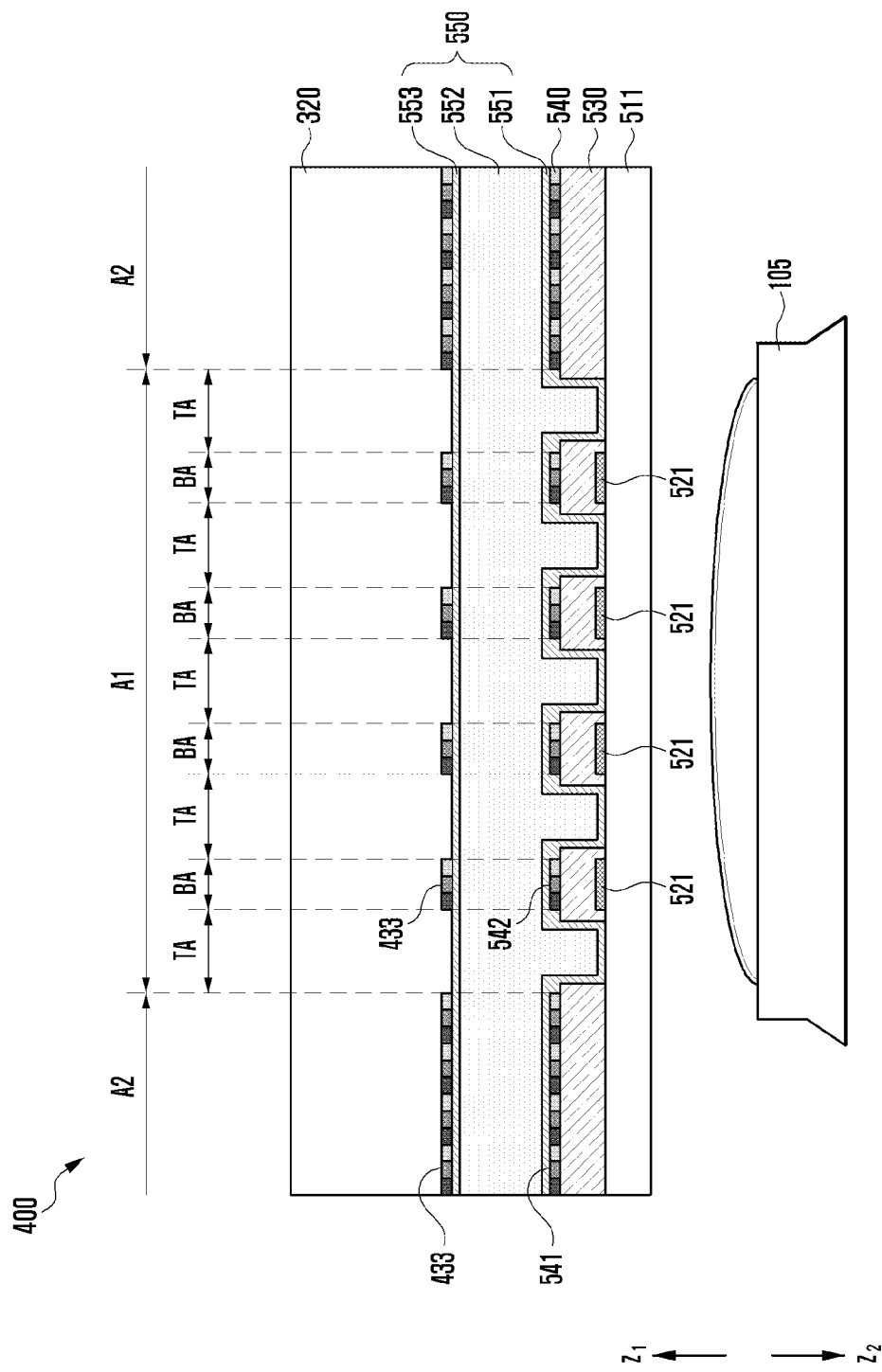
FIG. 5 is a cross-sectional view illustrating a UDC area (e.g., a first area) of a display according to various embodiments.

FIG. 5 is a cross-sectional view illustrating a camera overlapping area (e.g., a first area A1) of the display 400 according to various embodiments. For example, FIG. 5 may be a partial cross-sectional view of the electronic device 100 viewed from the line 5-5 of FIG. 1.

The display 400 shown in FIG. 5 may be similar at least in part to the display 400 shown in FIG. 4 or further include various embodiments.

With reference to FIG. 5, the display 400 according to an embodiment may include a substrate 511, an opaque mask 521 (or a bottom metal layer) formed in the first direction z1 (e.g., upward direction) from the substrate 511, a silicon layer 530 (e.g., low-temperature polycrystalline silicon (LTPS) or low-temperature polycrystalline oxide (LTPO)) formed in the first direction z1 from the substrate 511 including the opaque mask 521, a pixel layer 540 formed in the first direction z1 from the silicon layer 530, and/or an organic encapsulation layer 550 formed in the first direction z1 from the pixel layer 540. According to an embodiment, the color filter layer 433 may be formed in the first direction z1 from the organic encapsulation layer 550 of the display 400. According to an embodiment, a touch sensor layer (not shown) (e.g., the touch panel 432 in FIG. 4) may be further formed between the organic encapsulation layer 550 and the color filter layer 433. According to an embodiment, the touch sensor layer may be formed in the first direction z1 from the color filter layer 433. A window may be disposed as a front cover (e.g., the front cover 320 in FIG. 4) in the first direction z1 of the display 400.

According to an embodiment, the silicon layer 530 may include a thin film transistor (TFT) (not shown) for driving the pixel layer 540, and a plurality of wires. According to an embodiment, in the first area A1, the TFT and the plurality of wires may be disposed to overlap with the opaque mask 521. For example, in the first area A1, the TFT and the plurality of wires may be disposed in a light-blocking area BA corresponding to the opaque mask 521.

According to an embodiment, the pixel layer 540 may include organic light emitting diodes (OLED) type pixels. According to an embodiment, the pixel layer 540 may include a first subpixel (e.g., a first subpixel R1 in FIG. 6) representing a first color (e.g., red), a second subpixel (e.g., a second subpixel G1 in FIG. 6) representing a second color (e.g., green), and/or a third subpixel (e.g., a third subpixel B1 in FIG. 6) representing a third color (e.g., blue).

According to an embodiment, the first pixels 542 may be arranged in the first area A1, and the opaque mask 521 and the color filter layer 433 may be disposed to overlap with the first pixels 542. According to an embodiment, an area overlapping at least in part with the opaque mask 521 may be referred to as the light-blocking area BA.

According to an embodiment, the opaque mask 521 may be an opaque metal. According to various embodiments, the opaque mask 521 may be changed or modified to a term such as an anti-diffraction film, an anti-light transmission film, a low-reflection anti-diffraction film, or a low-reflection anti-light transmission film. According to various embodiments, the opaque mask 521 may be made of an organic or inorganic material in addition to an opaque metal. According to an embodiment, the material of the opaque mask 521 may include a composite stacked structure of a metal, an organic layer, and an inorganic layer. According to an embodiment, unlike the illustrated example, the opaque mask 521 may be disposed inside the substrate 511, below the substrate 511, or on at least some layer between the pixel and the substrate 511.

According to an embodiment, the opaque mask 521 may not be formed in a certain area among areas between the first pixels 542. For example, such an area between the first pixels 542 may be referred to as a transmission area TA.

According to an embodiment, the second pixels 541 may be arranged in the second area A2, and the color filter layer 433 may be disposed to overlap with the second pixels 541.

According to an embodiment, the arrangement density of the first pixels 542 may be lower than the arrangement density of the second pixels 541. For example, the second pixels 541 may be more densely arranged than the first pixels 542. According to an embodiment, the transmittance of the first area A1 may be increased by designing the arrangement density of the first pixels 542 to be lower than that of the second pixels 541.

According to an embodiment, the organic encapsulation layer 550 may include a first inorganic layer 551 formed in the first direction z1 from the pixel layer 540, an organic layer 552 formed in the first direction z1 from the first inorganic layer 551, and a second inorganic layer 553 formed in the first direction z1 from the organic layer 552.

According to an embodiment, the pixel layer 540 and the silicon layer 530 may be removed from the transmission area TA. For example, in the transmission area TA, the substrate 511 and the organic encapsulation layer 550 may be in contact with each other. For example, the substrate 511 and the first inorganic layer 551 of the organic encapsulation layer 550 may be in contact with each other in the transmission area TA.

According to an embodiment, by driving the luminance of light output from one pixel arranged in the first area A1 to be brighter than the luminance of light output from one pixel arranged in the second area A2, it is possible to reduce a luminance difference between the first area A1 and the second area A2. In this case, in order to reduce a burn-in difference (or lifespan difference) between the first area A1 and the second area A2, the electronic device 300 may be designed such that the size of the pixel disposed in the first area A1 is greater than the size of the pixel disposed in the second area A2.

Figure 6:
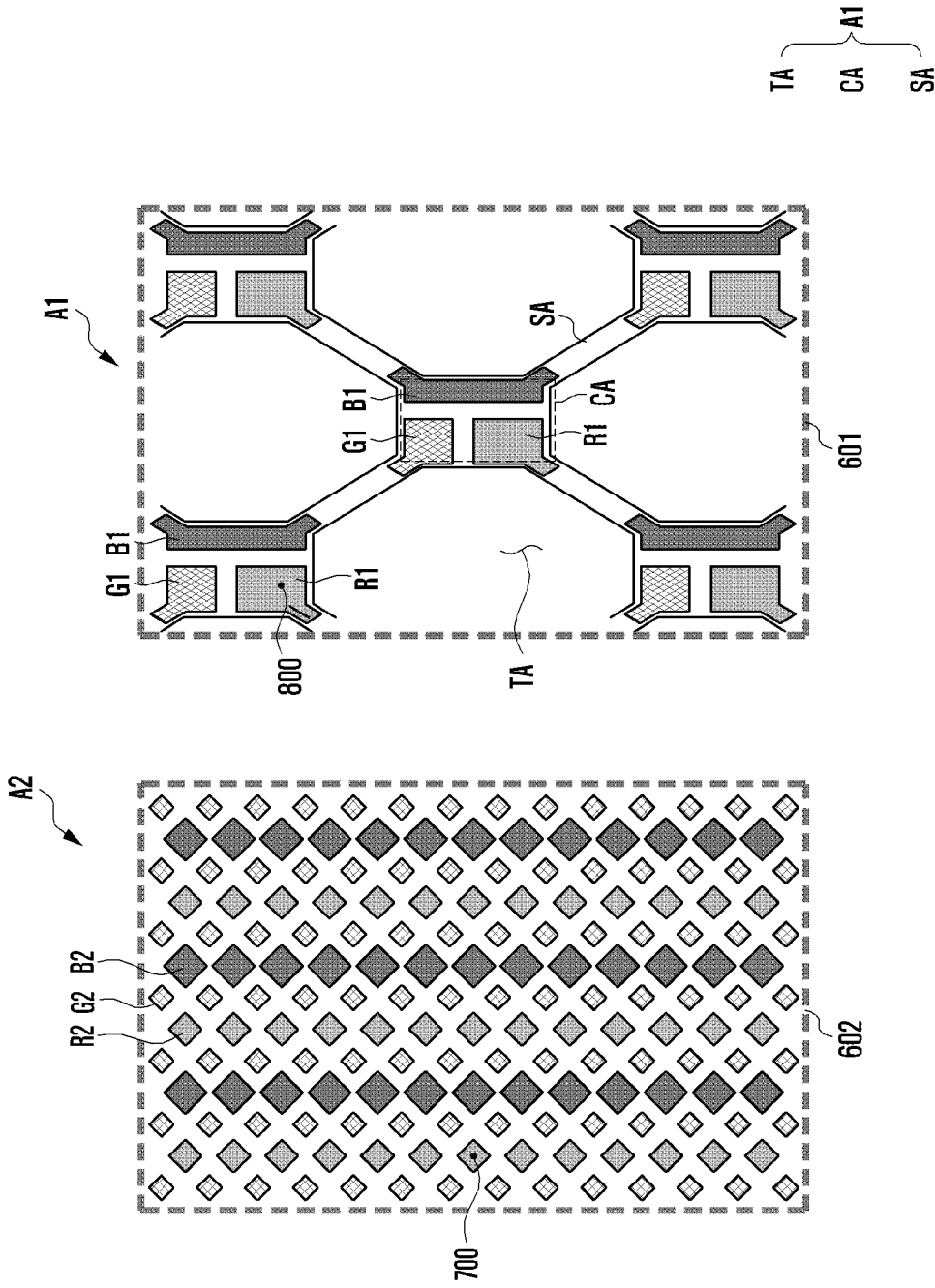
FIG. 6 is a diagram illustrating a UDC area (e.g., a first area) and a normal area (e.g., a second area) other than the UDC area of a display according to various embodiments

FIG. 6 is a diagram illustrating a UDC area (e.g., a first area A1) and a normal area (e.g., a second area A2) other than the UDC area of a display according to various embodiments.

With reference to FIG. 6, the pixel layer (e.g., the pixel layer 540 in FIG. 5) of the display 400 according to an embodiment may have the first area A1 and the second area A2. The second area A2 may be an area that does not overlap with the angle of view of the UDC, and may be an area other than the first area A1. For example, the UDC may have a designated angle of view. The first area A1 may be an area corresponding to the angle of view of the UDC, and the second area A2 may be an area not corresponding to the angle of view of the UDC.

According to an embodiment, the first area A1 may include a cluster area CA that contains the plurality of first pixels 542 and the driving circuit (e.g., TFT) for driving the first pixels 542 and overlaps with at least a portion of the opaque mask (e.g., the opaque mask 521 in FIG. 5), a wiring area SA that connects the cluster areas CA, and/or a transmission area TA that is disposed between the cluster areas CA and does not overlap with the opaque mask 521.

According to an embodiment, the plurality of first pixels 542 may be arranged in the first area A1. According to an embodiment, the plurality of first pixels 542 are subpixels of a first type and may include a first subpixel R1 representing a first color (e.g., red), a second subpixel G1 representing a second color (e.g., green), and/or a third subpixel B1 representing a third color (e.g., blue). According to an embodiment, in the first area A1, one first subpixel R1, one second subpixel G1, and one third subpixel B1 may be disposed adjacent to each other, thereby including one group. According to an embodiment, in the first area A1, an area in which the first subpixel R1, the second subpixel G1, and the third subpixel B1 including one group are disposed may be referred to as the cluster area CA. According to an embodiment, a plurality of cluster areas CA may be disposed at intervals in the first area A1, and the first subpixel R1, the second subpixel G1, and the third subpixel B1 including one group may be disposed in each cluster area CA.

According to an embodiment, an area in which the opaque mask 521 is not formed between the cluster areas CA of the first area A1 may be referred to as the transmission area TA. According to an embodiment, the transmission area TA may form a light path through which external light is introduced into the UDC.

According to an embodiment, an area where the opaque mask 521 is formed between the cluster areas CA of the first area A1 may be referred to as the wiring area SA. According to an embodiment, at least one signal wire (not shown) for driving the plurality of first pixels 542 may be disposed in the wiring area SA.

According to an embodiment, the plurality of second pixels 541 may be arranged in the second area A2. According to an embodiment, the plurality of second pixels 541 are subpixels of a second type and may include a first subpixel R2 representing a first color (e.g., red), a second subpixel G2 representing a second color (e.g., green), and/or a third subpixel B2 representing a third color (e.g., blue).

According to an embodiment, the density at which the first pixels 542 are disposed may be lower than the density at which the second pixels 541 are disposed. For example, the second pixels 541 may be more densely arranged than the first pixels 542. According to an embodiment, by designing the arrangement density of the first pixels 542 to be lower than that of the second pixels 541, it is possible to increase the transmittance of the first area A1. According to an embodiment, in a designated first area 601 that is a part of the first area A1, n subpixels of the first type (e.g., the first subpixel R1, the second subpixel G1, and the third subpixel B1) may be arranged at intervals. According to an embodiment, in a designated second area 602 that is a part of the second area A2, m subpixels of the second type (e.g., the first subpixel R2, the second subpixel G2, and the third subpixels B2) may be arranged at intervals. Here, 'n' may be smaller than 'm'.

According to an embodiment, by driving the luminance of light output from one pixel arranged in the first area A1 to be brighter than the luminance of light output from one pixel arranged in the second area A2, it is possible to reduce a luminance difference between the first area A1 and the second area A2. In this case, in order to reduce a burn-in difference (or lifespan difference) between the first area A1 and the second area A2, the electronic device 300 may be designed such that each size of the pixels disposed in the first area A1 is greater than each size of the pixels disposed in the second area A2.

According to an embodiment, in order to drive the luminance of the first pixel 542 to be brighter than the luminance of the second pixel 541, a first pixel driving circuit 800 for driving the first pixel 542 and a second pixel driving circuit 700 for driving the second pixel 541 may be different in shape from each other. For example, under the first pixel 542, a driving TFT (DT) of a first type (e.g., the first driving TFT (DT1) in FIG. 8) may be disposed as a part of the first pixel driving circuit 800 for driving the first pixel 542. For example, under the second pixel 541, a driving TFT (DT) of a second type (e.g., the second driving TFT (DT2) in FIG. 7) may be disposed as a part of the second pixel driving circuit 700 for driving the second pixel 541.

According to an embodiment, the first driving TFT (DT1) may be configured to supply a first current to the first pixel 542.

According to an embodiment, the second driving TFT (DT2) may be configured to supply a second current to the second pixel 541.

According to an embodiment, the first driving TFT (DT1) may supply the first current higher than the second current to the first pixel 542 so as to make the luminance of the first pixel 542 higher than the luminance of the second pixel 541.

Hereinafter, different structures of the first driving TFT (DT1) and the second driving TFT (DT2) will be described in greater detail with reference to FIGS. 7 and 8.

Figure 7:
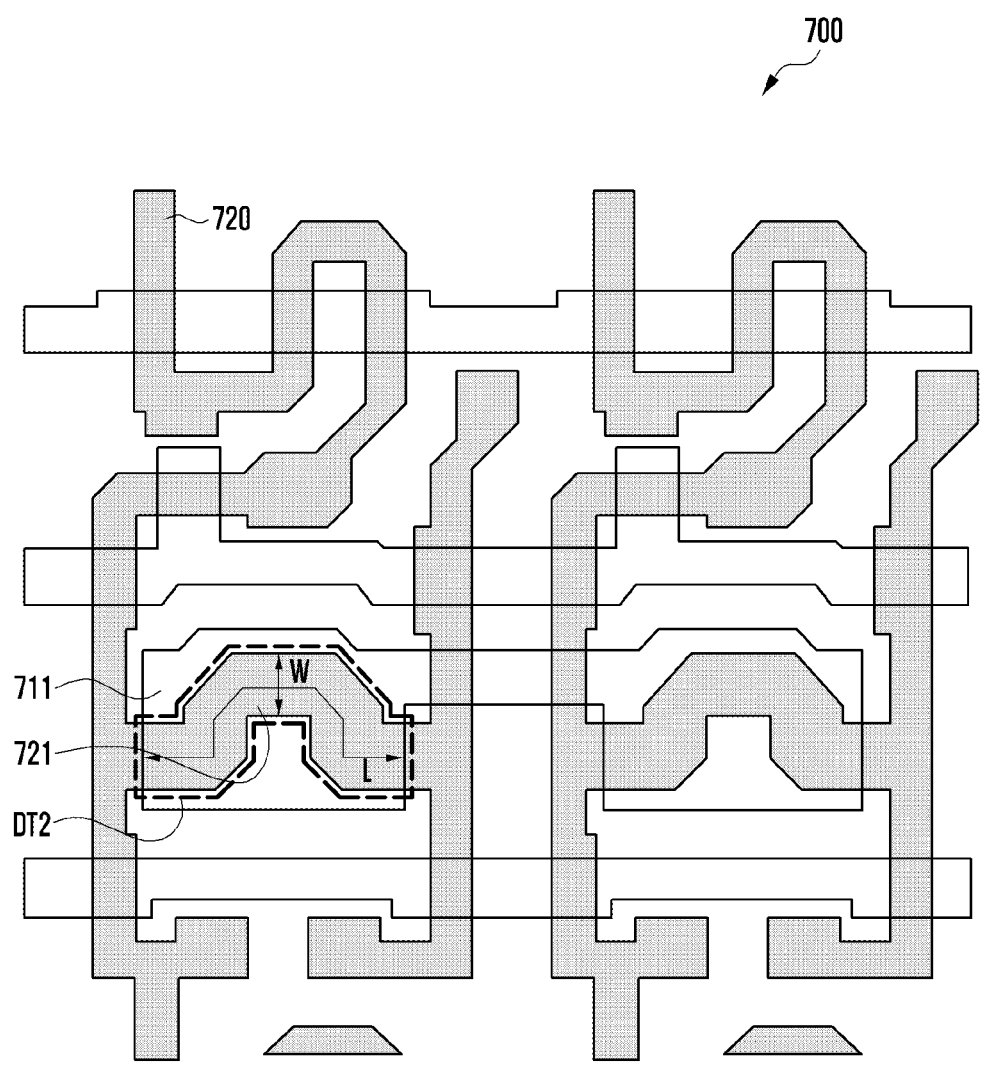
FIG. 7 is a diagram illustrating a pixel driving circuit disposed in a normal area (e.g., a second area) of a display according to various embodiments.

FIG. 7 is a layout diagram illustrating a pixel driving circuit disposed in a normal area (e.g., a second area A2) of a display according to various embodiments. FIG. 8 is a layout diagram illustrating a pixel driving circuit disposed in a UDC area (e.g., a first area A1) of a display according to various embodiments. For example, FIGS. 7 and 8 may be plan views illustrating at least a portion of the pixel layer 540 shown in FIG. 5.

With reference to FIG. 7, the silicon layer (e.g., the silicon layer 530 in FIG. 5) of the display (e.g., the display 400 in FIG. 4) according to an embodiment may include a semiconductor pattern 720 and a plurality of electrode patterns disposed to overlap with at least a portion of the semiconductor pattern 720. The semiconductor pattern 720 may include polysilicon or an oxide semiconductor. At least a portion of the semiconductor pattern 720 may include a channel region 721 doped with a p-type impurity (e.g., boron (B)) or an n-type impurity (e.g., phosphorus (P)), thereby forming a TFT. The plurality of electrode patterns may include at least one gate electrode pattern 711, at least one source electrode pattern (not shown), and/or at least one drain electrode pattern (not shown).

According to an embodiment, the second area A2 includes the second pixel driving circuit 700 for driving the second pixel 541, and the second pixel driving circuit 700 may include the second driving TFT (DT2). The second driving TFT (DT2) may include a second gate electrode pattern 711 and a second channel region 721 disposed to overlap with at least a portion of the second gate electrode pattern 711. According to an embodiment, the second channel region 721 forming the second driving TFT (DT2) may have various curved shapes such as an English alphabet 'reverse S', 'S', 'M', or 'W'.

A symbol "W" in FIG. 7 may indicate a channel width of the second driving TFT (DT2). A symbol "L" in FIG. 7 may indicate a channel length of the second driving TFT (DT2).

Figure 8:
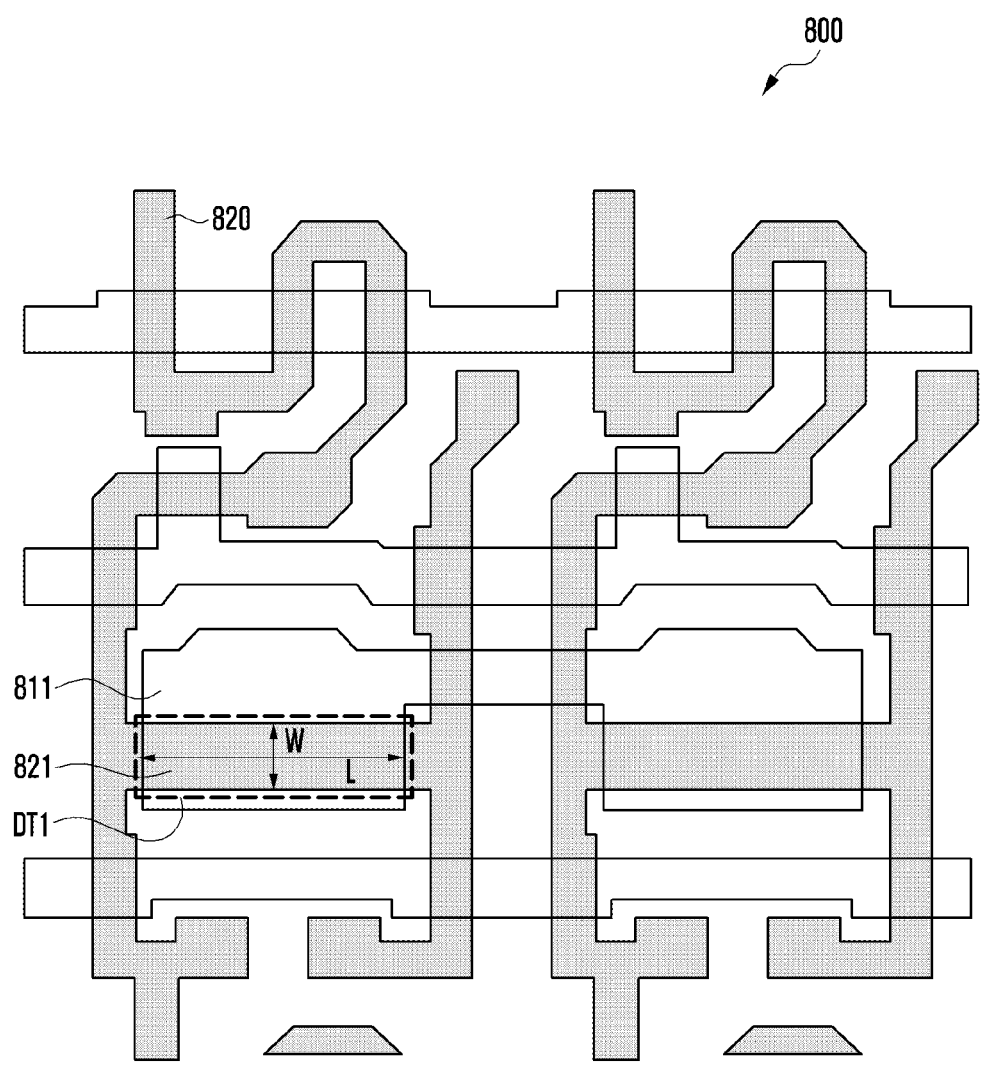
FIG. 8 is a diagram illustrating a pixel driving circuit disposed in a UDC area (e.g., a first area) of a display according to various embodiments.

With reference to FIG. 8, the silicon layer (e.g., the silicon layer 530 in FIG. 5) of the display (e.g., the display 400 in FIG. 4) according to an embodiment may include a semiconductor pattern 820 and a plurality of electrode patterns disposed to overlap with at least a portion of the semiconductor pattern 820, and the plurality of electrode patterns may include a gate electrode pattern 811. The semiconductor pattern 820 shown in FIG. 8 may be formed on the same layer as the semiconductor pattern 720 shown in FIG. 7. The first gate electrode pattern 811 shown in FIG. 8 may be formed on the same layer as the second gate electrode pattern 711 shown in FIG. 7.

According to an embodiment, the first area A1 includes the first pixel driving circuit 800 for driving the first pixel 542, and the first pixel driving circuit 800 may include the first driving TFT (DT1). The first driving TFT (DT1) may include a first gate electrode pattern 811 and a first channel region 821 disposed to overlap with at least a portion of the first gate electrode pattern 811. According to an embodiment, the first channel region 821 forming the first driving TFT (DT1) may have a straight shape that does not include a curved shape. For example, the first channel region 821 forming the first driving TFT (DT1) does not have a curved shape such as an English alphabet 'reverse S', 'S', 'M', or 'W'.

As the first channel region 821 is formed to have a straight shape, it is possible to increase the first current supplied to the first pixel 542 from the first driving TFT (DT1) while reducing the area of the first driving TFT (DT1). For example, the driving current supplied to the OLED from the driving TFT (DT) may be defined as in Equation 1.

$$I_d = \mu C \frac{W}{2L}(V_g - V_{on})^2 \quad \text{[Equation 1]}$$

Id: Drain current
μ: mobility
C: cap
W: width
L: length
$V_g$: gate voltage
$V_{on}$: threshold voltage With reference to Equation 1, it can be seen that the driving current supplied to the OLED from the driving TFT (DT) is proportional to the channel width (W) and inversely proportional to the channel length (L).

According to an embodiment, the first driving TFT (DT1) may have an increased channel width (W) or a decreased channel length (L) as the first channel region 821 is formed to have a straight shape. For example, the first channel width (W) of the first driving TFT (DT1) shown in FIG. 8 may be greater than the second channel width (W) of the second driving TFT (DT2) shown in FIG. 7. For example, the first channel length (L) of the first driving TFT (DT1) shown in FIG. 8 may be smaller than the second channel length (L) of the second driving TFT (DT2) shown in FIG. 7.

According to an embodiment, a distance between the TFTs (e.g., the first driving TFTs (DT1)) forming the first pixel driving circuit 800 shown in FIG. 8 may be smaller than a distance between the TFTs (e.g., the second driving TFTs (DT2)) forming the second pixel driving circuit 700 shown in FIG. 7. For example, as the distance between the TFTs (e.g., the first driving TFTs (DT1)) forming the first pixel driving circuit 800 is designed to be relatively narrow, it is possible to reduce the area of the light-blocking area BA and increase the light transmittance in the first area overlapping with at least a portion of the UDC.

In the case where the first driving TFT (DT1) and the second driving TFT (DT2) according to an embodiment have different structures as described in FIGS. 7 and 8, a lifespan or burn-in difference between the first pixel 542 and the second pixel 541 may occur. In order to reduce such a lifespan or burn-in difference between the first pixel 542 and the second pixel 541, the display according to various embodiments may be designed to enlarge the area of the anode and/or the organic layer of the OLED as shown in FIGS. 9 and 10.

Figure 9:
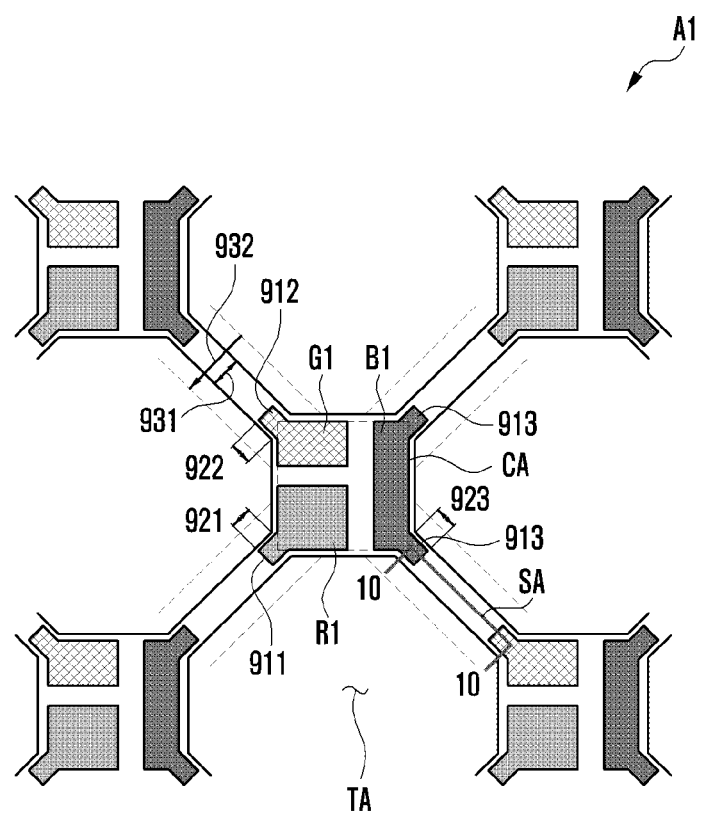
FIG. 9 is a diagram illustrating a portion of a UDC area (e.g., a first area) of a display according to various embodiments.
Figure 10:
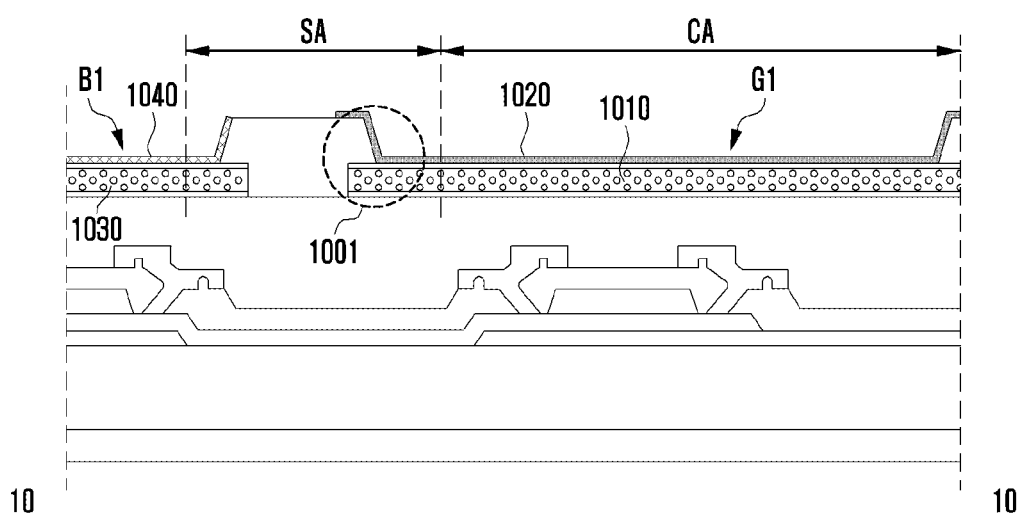
FIG. 10 is a cross-sectional view of a portion of a UDC area (e.g., a first area) of the display of FIG. 9 according to various embodiments.

FIG. 9 is a diagram illustrating a portion of a UDC area (e.g., a first area A1) of a display according to various embodiments. FIG. 10 is a cross-sectional view of a portion of a UDC area (e.g., a first area A1) of the display according to the embodiment shown in FIG. 9. For example, FIG. 10 may be a partial cross-sectional view showing a layered structure of the display according to an embodiment viewed from the line 10-10 of FIG. 9.

With reference to FIG. 9, the first area A1 of the display according to an embodiment may include a plurality of cluster areas CA in which a plurality of first pixels 542 are disposed, a wiring area SA connecting the plurality of cluster areas CA and having at least one signal wire (not shown) disposed, and a transmission area TA.

According to an embodiment, the plurality of cluster areas CA and the wiring area SA may form a light-blocking area BA (e.g., the light-blocking area BA in FIG. 5) that overlaps with the opaque mask 521.

According to an embodiment, in each of the plurality of cluster areas CA, one first subpixel R1, one second subpixel G1, and one third subpixel B1 are disposed adjacently to form one group.

According to an embodiment, the first pixels 542 may have extensions 911, 912, and 913 extending from the cluster area CA to a portion of the wiring area SA. For example, the first subpixel R1, the second subpixel G1, and/or the third subpixel B1 are disposed in each cluster area CA, and the first subpixel R1, the second subpixel G1, and the third subpixel B1 may have the extensions 911, 912, and 913, respectively.

According to an embodiment, the first subpixel R1 includes a first extension 911, and the first extension 911 may include a first anode (not shown) and a first organic layer (not shown) formed to extend from the cluster area CA to a portion of the wiring area SA adjacent to the first subpixel R1.

According to an embodiment, the second sub-pixel G1 includes a second extension 912, and the second extension 912 may include a second anode (e.g., the second anode 1010 in FIG. 10) and a second organic layer (e.g., the second organic layer 1020 in FIG. 10) formed to extend from the cluster area CA to a portion of the wiring area SA adjacent to the second sub-pixel G1.

According to an embodiment, the third sub-pixel B1 includes a third extension 913, and the third extension 913 may include a third anode (e.g., the third anode 1030 in FIG. 10) and a third organic layer (e.g., the third organic layer 1040 in FIG. 10) formed to extend from the cluster area CA to a portion of the wiring area SA adjacent to the third sub-pixel B1.

According to an embodiment, the first extension 911 of the first subpixel R1 may be formed to have a first length 921.

According to an embodiment, the second extension 912 of the second subpixel G1 may be formed to have a second length 922.

According to an embodiment, the third extension 913 of the third sub-pixel B1 may be formed to have a third length 923.

According to an embodiment, the first length 921, the second length 922, and the third length 923 may all be equal to each other.

According to an embodiment, the first length 921, the second length 922, and the third length 923 may be different from each other.

According to an embodiment, in the display 400, the width of the wiring area SA may be increased from a first width 931 to a second width 932 so as to increase the deposition area of the extensions 911, 912, and 913. According to an embodiment, even if the width of the wiring area SA in the first area A1 is increased, the area of the transmission area TA may remain substantially unchanged or increase because the distance (e.g., pixel pitch) between the TFTs (e.g., the first driving TFTs (DT1)) forming the first pixel driving circuit 800 is reduced as described in FIG. 8. For example, because the opaque mask 521 is formed to increase in width in the wiring area SA but decreases in width in the cluster area CA, the area of the transmission area TA may not substantially change or may increase.

According to an embodiment, the wiring area SA may be formed to have the constant second width 932 between two adjacent cluster areas CA. For example, the wiring area SA may have the same second width 932 in a portion where the extensions 911, 912, and 913 of the first pixel 542 are formed and in a portion where the extensions 911, 912, and 913 of the first pixel 542 are not formed.

According to an embodiment, the wiring area SA may be formed to have the first width 931 or the second width 932 not constant between two adjacent cluster areas CA. For example, the wiring area SA may have the relatively large second width 932 in a portion corresponding to the extension of the first pixel 542 and have the relatively small first width 931 in a portion where the extension of the first pixel 542 is not formed.

With reference to FIG. 10, the subpixels R1, G1, and B1 of the first area A1 according to an embodiment are OLED-type subpixels and may include anodes 1010 and 1030 and organic layers 1020 and 1040 stacked on the anodes 1010 and 1010. FIG. 10 shows a portion of the second subpixel G1 and a portion of the third subpixel B1 disposed with the wiring area SA interposed therebetween.

According to an embodiment, the second subpixel G1 may include the second anode 1010 and the second organic layer 1020 stacked on the second anode 1010. As shown, the second anode 1010 and the second organic layer 1020 may have a second extension 1001 (e.g., the second extension 912 in FIG. 9) extending partly into the wiring area SA, in addition to a portion formed within the cluster area CA.

According to an embodiment, the third subpixel B1 may include the third anode 1030 and the third organic layer 1040 stacked on the third anode 1030. Although not shown, the first subpixel R1 may include a first anode and a first organic layer stacked on the first anode. According to an embodiment, similarly to the second extension of FIG. 10, the first anode and the first organic layer of the first subpixel R1 may have a first extension (e.g., the first extension 911 in FIG. 9) extending partly into the wiring area SA. According to an embodiment, similarly to the second extension of FIG. 10, the third anode and the third organic layer of the third subpixel B1 have a third extension (e.g., the third extension 913 in FIG. 9) extending partly into the wiring area SA.

The display according to various embodiments includes the extension 1001 that the first pixel 542 disposed in the first area A1 extends to the wiring area SA, thereby reducing the lifespan or burn-in difference between the first pixel 542 and the second pixel 541 that may occur when the first driving TFT (DT1) of the first area A1 and the second driving TFT (DT2) of the second area A2 have different structures.

Figure 11:
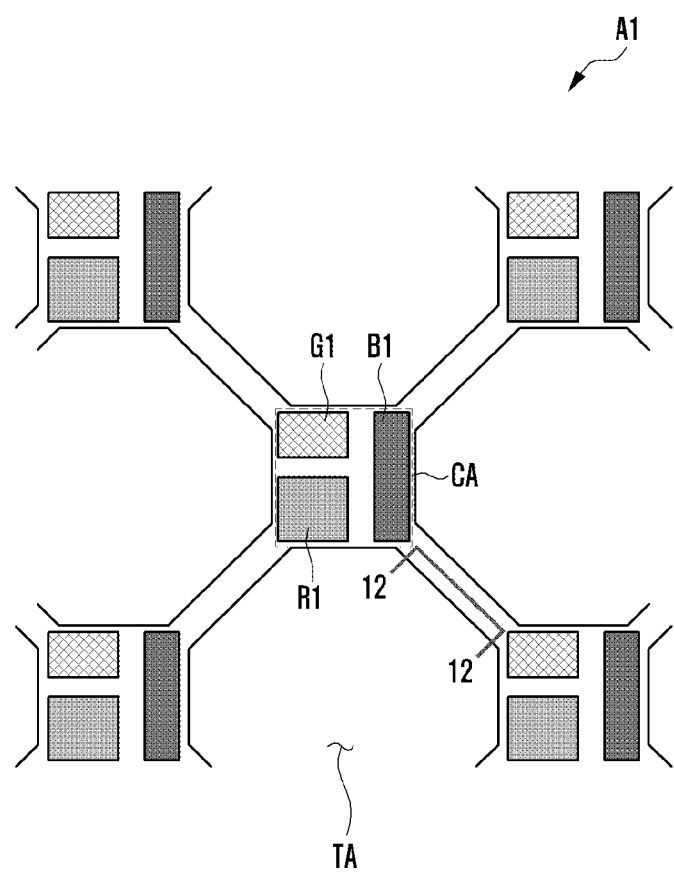
FIG. 11 is a diagram illustrating a portion of a UDC area (e.g., a first area) of a display according to a comparative example.
Figure 12:
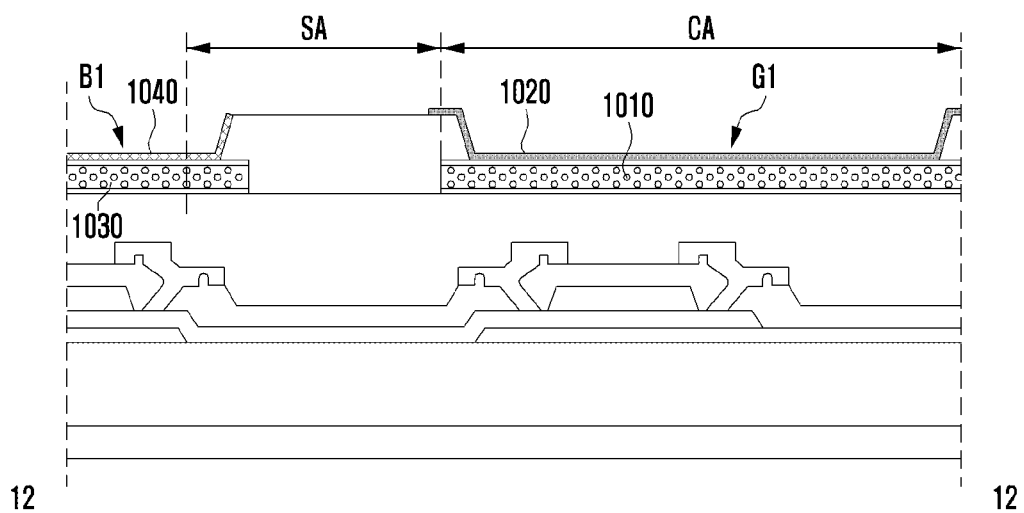
FIG. 12 is a cross-sectional view of a portion of the UDC area (e.g., a first area) of the display according to the comparative example shown in FIG. 11.

FIG. 11 is a diagram illustrating a portion of a UDC area (e.g., a first area A1) of a display according to a comparative example. FIG. 12 is a cross-sectional view of a portion of the UDC area (e.g., a first area A1) of the display according to the comparative example shown in FIG. 11. For example, FIG. 12 may be a partial cross-sectional view of the display according to the comparative example viewed from the line 12-12 of FIG. 11.

With reference to FIGS. 11 and 12, in the display according to the comparative example, the first pixels 542 may not have extensions (e.g., the extensions 911, 912, and 913 in FIG. 9). For example, the first subpixel R1, the second subpixel G1, and/or the third subpixel B1 of the first pixels 542 may be disposed in the cluster area CA and may not be formed in the wiring area SA.

Compared to the display according to the embodiment shown in FIGS. 9 and 10, the display according to the comparative example shown in FIGS. 11 and 12 may have an increased lifespan or burn-in difference between the first pixel 542 and the second pixel 541 when the first driving TFT (DT1) of the first area A1 and the second driving TFT (DT2) of the second area A2 have different structures.

Figure 13:
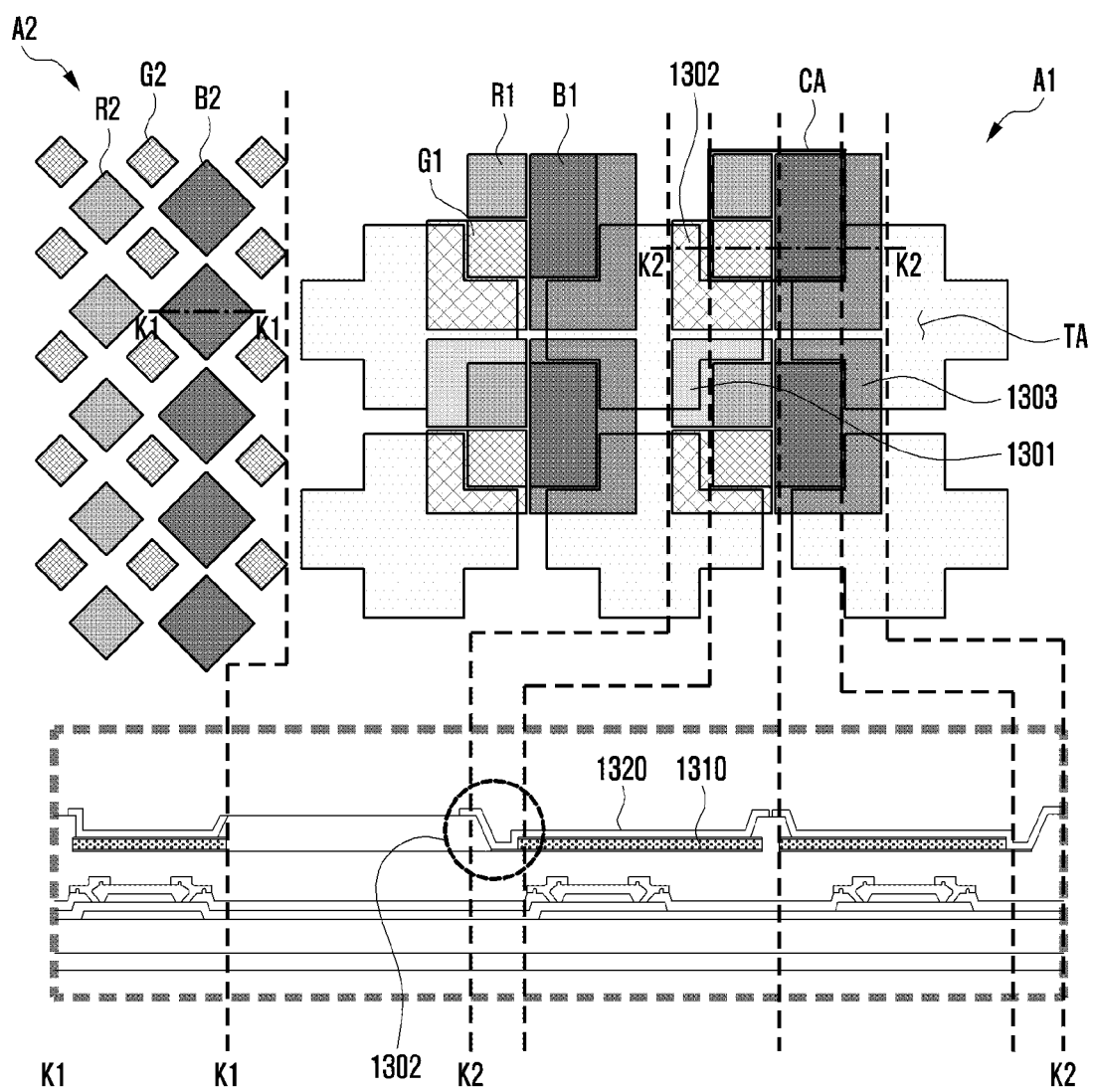
FIG. 13 is a diagram illustrating a UDC area (e.g., a first area) and a normal area (e.g., a second area) other than the UDC area of a display according to various embodiments.
Figure 14:
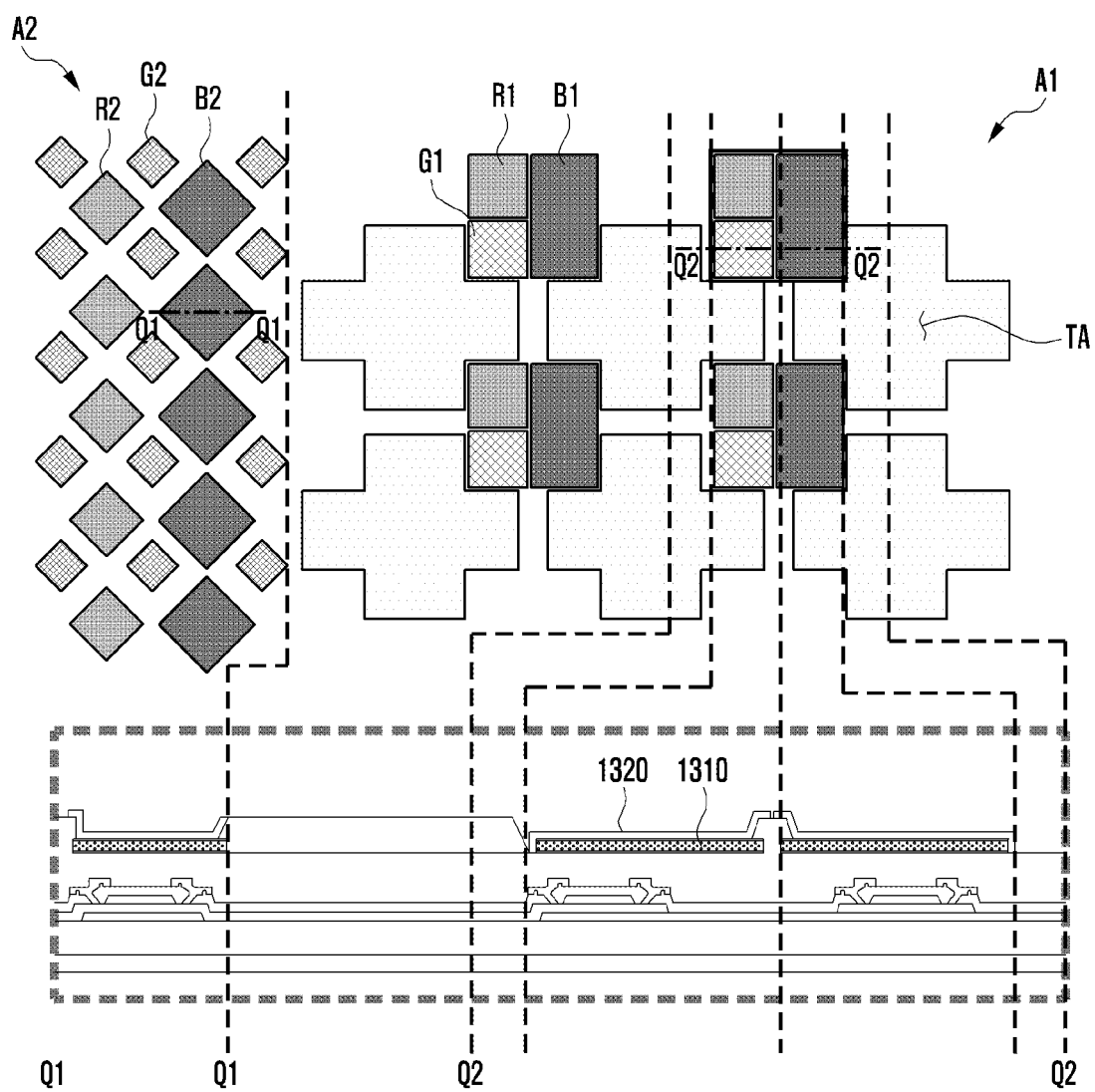
FIG. 14 is a diagram illustrating a UDC area (e.g., a first area) and a normal area (e.g., a second area) other than the UDC area of a display according to a comparative example.

FIG. 13 is a diagram illustrating a UDC area (e.g., a first area A1) and a normal area (e.g., a second area A2) other than the UDC area of a display according to various embodiments, and a cross-sectional view taken along lines K1-K1 and K2-K2. FIG. 14 is a diagram illustrating a UDC area (e.g., a first area A1) and a normal area (e.g., a second area A2) other than the UDC area of a display according to a comparative example, and a cross-sectional view taken along lines Q1-Q1 and Q2-Q2.

With reference to FIG. 13, the display (e.g., the display 400 in FIG. 4) according to an embodiment may include transparent light-emitting portions 1301, 1302, and 1303 in which the first pixels 542 disposed in the first area A1 extend partly into the transmission area TA. The transparent light-emitting portions 1301, 1302, and 1303 may be configured to include an anode 1310 including a transparent anode (e.g., the lower transparent electrode 1621 and/or the upper transparent electrode 1623 in FIG. 16) and an organic layer 1320 (e.g., the second portion 1632 of the organic layer 1630 in FIG. 16) stacked on the anode 1310. With reference to FIG. 14, unlike the display according to the embodiment shown in FIG. 13, in the display according to the comparative example, the first pixel 542 may not include the transparent light-emitting portions 1301, 1302, and 1303.

As shown in FIG. 13, each of the first subpixel R1, the second subpixel G1, and/or the third subpixels B1 of the first pixels 542 disposed in the first area A1 according to an embodiment may include the anode 1310 and the organic layer 1320 stacked on the anode 1310.

According to an embodiment, each of the first subpixel R1, the second subpixel G1, and/or the third subpixel B1 may include the transparent light-emitting portions 1301, 1302, and 1303 extending partly into the transmission area TA. The transparent light-emitting portions 1301, 1302, and 1303 may include the anode 1310 made of a transparent material and the organic layer 1320 stacked on the anode 1310. Hereinafter, the transparent light-emitting portions 1301, 1302, and 1303 will be described in detail.

According to an embodiment, the first subpixel R1 may include a first anode disposed to correspond to the cluster area CA, and a first organic layer stacked on the first anode. According to an embodiment, the first anode of the first subpixel R1 may have a structure in which at least one opaque electrode (e.g., Ag) and at least one transparent electrode (e.g., indium tin oxide (ITO)) are stacked. According to an embodiment, the at least one transparent electrode of the first anode may be formed to correspond to the cluster area CA and extend from the cluster area CA to a portion of the transmission area TA. In the first anode, the transparent electrode formed to extend partly into the transmission area TA may be referred to as a first transparent anode. According to an embodiment, in the first subpixel R1, the first organic layer stacked on the first anode extends partly into the transmission area TA to cover the first transparent anode, thereby forming a first transparent light-emitting portion 1301. For example, the first transparent light-emitting portion 1301 may include the first transparent anode and the first organic layer covering the first transparent anode. The first transparent light-emitting portion 1301 is an area through which light can pass, and can provide an effect of improving transmittance and expanding a light-emitting area by outputting light of a designated color (e.g., red).

According to an embodiment, the second subpixel G1 may include a second anode disposed to correspond to the cluster area CA, and a second organic layer stacked on the second anode. According to an embodiment, the second anode of the second subpixel G1 may have a structure in which at least one opaque electrode and at least one transparent electrode are stacked. According to an embodiment, the at least one transparent electrode of the second anode may be formed to correspond to the cluster area CA and extend from the cluster area CA to a portion of the transmission area TA. In the second anode, the transparent electrode formed to extend partly into the transmission area TA may be referred to as a second transparent anode. According to an embodiment, in the second subpixel G1, the second organic layer stacked on the second anode extends partly into the transmission area TA to cover the second transparent anode, thereby forming a second transparent light-emitting portion 1302. For example, the second transparent light-emitting portion 1302 may include the second transparent anode and the second organic layer covering the second transparent anode. The second transparent light-emitting portion 1302 is an area through which light can pass, and can provide an effect of improving transmittance and expanding a light-emitting area by outputting light of a designated color (e.g., green).

According to an embodiment, the third subpixel B1 may include a third anode disposed to correspond to the cluster area CA, and a third organic layer stacked on the third anode. According to an embodiment, the third anode of the third subpixel B1 may have a structure in which at least one opaque electrode and at least one transparent electrode are stacked. According to an embodiment, the at least one transparent electrode of the third anode may be formed to correspond to the cluster area CA and extend from the cluster area CA to a portion of the transmission area TA. In the third anode, the transparent electrode formed to extend partly into the transmission area TA may be referred to as a third transparent anode. According to an embodiment, in the third subpixel B1, the third organic layer stacked on the third anode extends partly into the transmission area TA to cover the third transparent anode, thereby forming a third transparent light-emitting portion 1303. For example, the third transparent light-emitting portion 1303 may include the third transparent anode and the third organic layer covering the third transparent anode. The third transparent light-emitting portion 1303 is an area through which light can pass, and can provide an effect of improving transmittance and expanding a light-emitting area by outputting light of a designated color (e.g., blue).

As shown in FIG. 13, in the display according to an embodiment, the pixel density of the first area A1 is lowered, thereby reducing the phenomenon in which the lattice structure is visually recognized by the user. Also, by forming the transparent light-emitting portions 1301, 1302, and 1303 in the first area A1, the light emitting area can be expanded.

Figure 15:
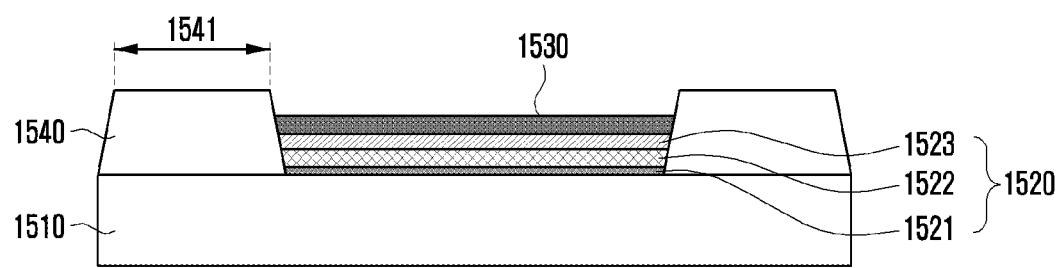
FIG. 15 is a cross-sectional view illustrating a stacked structure of a pixel disposed in a normal area (e.g., a second area) of a display according to various embodiments.
Figure 16:
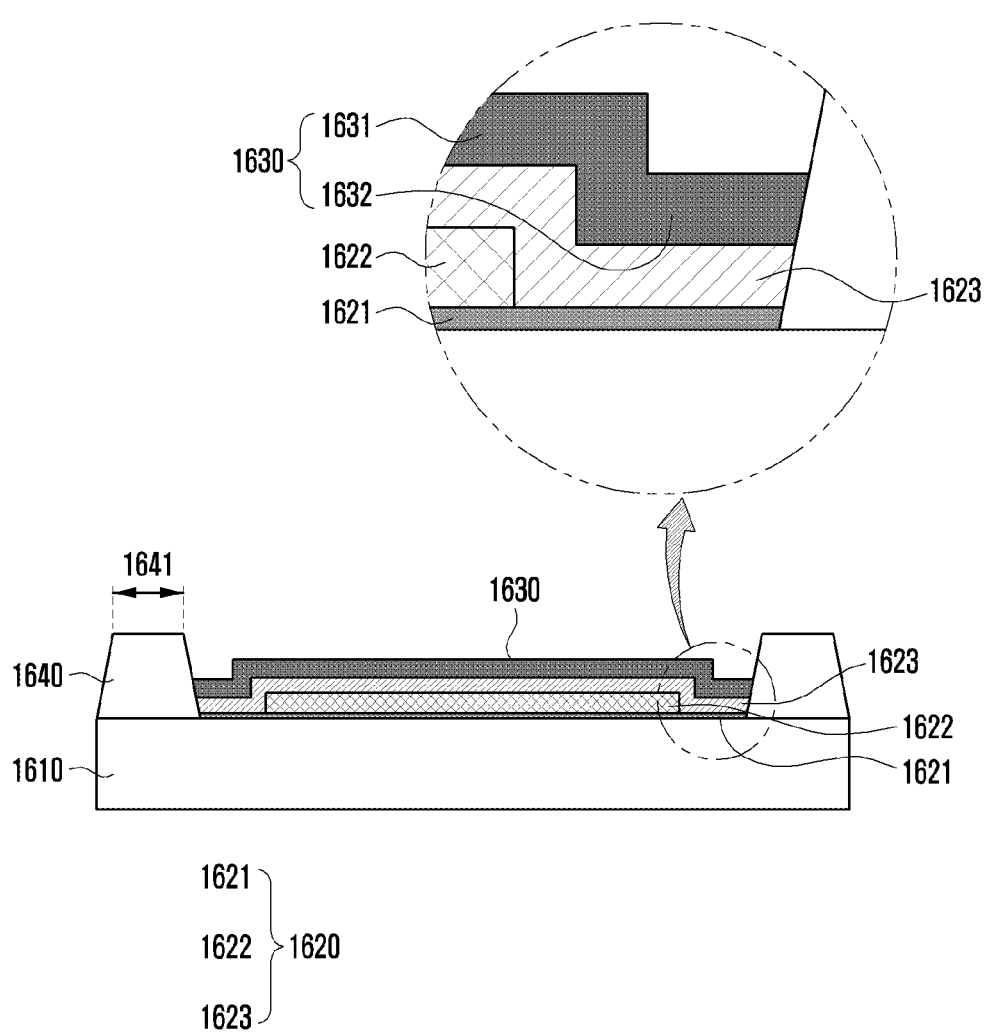
FIG. 16 is a cross-sectional view illustrating a stacked structure of a pixel disposed in a UDC area (e.g., a first area) of a display according to various embodiments.

FIG. 15 is a cross-sectional view illustrating a stacked structure of a pixel disposed in a normal area (e.g., a second area A2) of a display according to various embodiments. For example, FIG. 15 may be a cross-sectional view illustrating a stacked structure of any one pixel disposed in the normal area (e.g., the second area A2) shown in FIG. 13. FIG. 16 is a cross-sectional view illustrating a stacked structure of a pixel disposed in a UDC area (e.g., a first area A1) of a display according to various embodiments. For example, FIG. 16 may be a cross-sectional view illustrating a stacked structure of a pixel disposed in the UDC area (e.g., the first area A1) shown in FIG. 13.

With reference to FIG. 15, the second pixel (e.g., the second pixel 541 in FIG. 5) disposed in the second area A2 of the display according to an embodiment includes an OLED, and the OLED may include an anode 1520, an organic layer 1530 stacked on the anode 1520, and a cathode (not shown) stacked on the organic layer 1530. The anode 1520 and the organic layer 1530 may be formed on an insulating layer 1510 (e.g., the substrate 511 in FIG. 5). According to an embodiment, the anode 1520 and the organic layer 1530 may be partitioned by a pixel definition layer (PDL) 1540. For example, the pixel definition layer 1540 may form a boundary between adjacent subpixels. According to an embodiment, the pixel definition layer 1540 formed between two adjacent subpixels in the second area A2 may have a third width 1541.

According to an embodiment, the anode 1520 formed in the second area A2 may have a structure in which at least one opaque electrode 1522 and at least one transparent electrode 1521 and 1523 are stacked. According to an embodiment, the opaque electrode 1522 may include, but is not limited to, an Ag material. According to an embodiment, the transparent electrodes 1521 and 1523 may include, but is not limited to, indium tin oxide (ITO). According to an embodiment, the anode 1520 formed in the second area A2 may include a lower transparent electrode 1521 formed on the insulating layer 1510, the opaque electrode 1522 formed on the lower transparent electrode 1521, and/or an upper transparent electrode 1523 formed on the opaque electrode 1522.

With reference to FIG. 16, the first pixel (e.g., the first pixel 542 in FIG. 5) disposed in the first area A1 of the display (e.g., the display 400 in FIG. 4) according to an embodiment includes an OLED, and the OLED may include an anode 1620, an organic layer 1630 stacked on the anode 1620, and a cathode (not shown) stacked on the organic layer 1630. The anode 1620 and the organic layer 1630 may be formed on an insulating layer 1610 (e.g., the substrate 511 in FIG. 5). According to an embodiment, the anode 1620 and the organic layer 1630 may be partitioned by a pixel definition layer (PDL) 1640. For example, the pixel definition layer 1640 may form a boundary between adjacent subpixels. According to an embodiment, the pixel definition layer 1640 formed between two adjacent subpixels in the first area A1 may have a fourth width 1641. The fourth width 1641 may be smaller than the third width 1541 described with reference to FIG. 15. In the display 400 according to an embodiment, as the fourth width 1641 is smaller than the third width 1541, it is possible to increase the area of the transmission area of the first area A1 (e.g., the transmission area TA in FIG. 5) and increase the light transmittance of the first area A1.

According to an embodiment, the anode 1620 formed in the first area A1 may have a structure in which at least one opaque electrode 1622 and at least one transparent electrode 1621 and 1623 are stacked. According to an embodiment, the opaque electrode 1622 may include, but is not limited to, an Ag material. According to an embodiment, the transparent electrodes 1621 and 1623 may include, but is not limited to, indium tin oxide (ITO). According to an embodiment, the anode 1620 formed in the first area A1 may include a lower transparent electrode 1621 formed on the insulating layer 1610, the opaque electrode 1622 formed on the lower transparent electrode 1621, and/or an upper transparent electrode 1623 formed on the opaque electrode 1622.

According to an embodiment, at least one layer of the lower transparent electrode 1621 and the upper transparent electrode 1623 of the anode 1620 formed in the first are A1 may extend toward the pixel definition layer 1640 and form the transparent light-emitting portions 1301, 1302, and 1303 described with reference to FIG. 13. For example, in the anode 1620 formed in the first area A1 and having a structure in which at least one opaque electrode 1622 and at least one transparent electrode are stacked, the upper transparent electrode 1623 and/or the lower transparent electrode 1621 may extend partly into the transmission area TA. According to an embodiment, the organic layer 1630 formed in the first area A1 is disposed to cover the extension of the lower transparent electrode 1621 (or the extensions of the upper transparent electrode 1623 and the lower transparent electrode 1621 or the extension of the upper transparent electrode 1623) adjacent to the pixel definition layer 1640, thereby forming the transparent light-emitting portions 1301, 1302, and 1303. For example, the organic layer 1630 formed in the first area A1 may include a first portion 1631 overlapping a portion of the anode 1620 including the opaque electrode 1622, and a second portion 1632 disposed outside the first portion 1631 and overlapping with the at least one transparent electrode 1621 and 1623 that is the extension of the anode 1620.

FIG. 16 shows that both the lower transparent electrode 1621 and the upper transparent electrode 1623 extend outward to form the transparent light-emitting portions 1301, 1302, and 1303, but this is not a limitation. For example, only the lower transparent electrode 1621 or only the upper transparent electrode 1623 may extend outward to form the transparent light-emitting portions 1301, 1302, and 1303.

Figure 17:
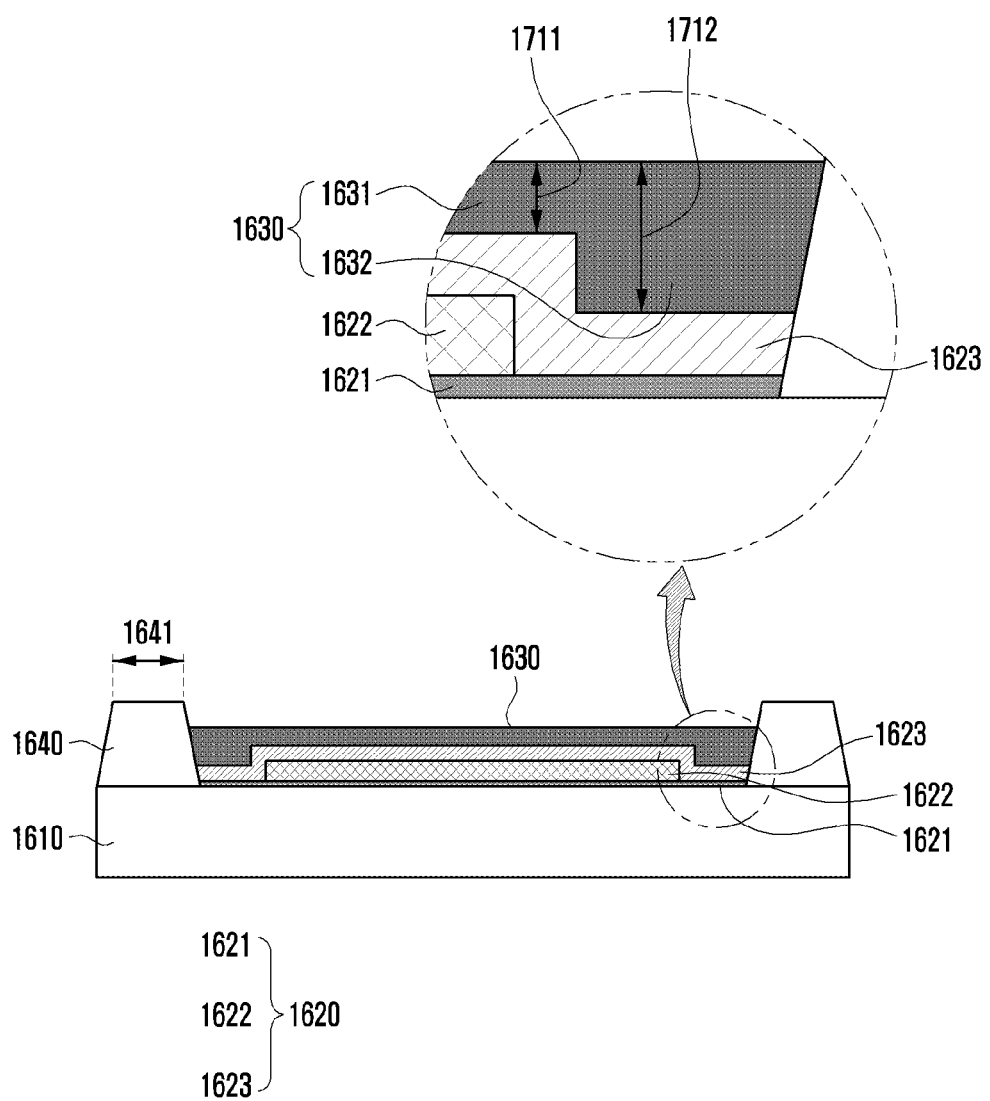
FIG. 17 is a cross-sectional view illustrating a stacked structure of a pixel disposed in a UDC area (e.g., a first area) of a display according to various embodiments.

FIG. 17 is a cross-sectional view illustrating a stacked structure of a pixel disposed in a UDC area (e.g., a first area A1) of a display according to various embodiments. For example, FIG. 17 may be a cross-sectional view illustrating a stacked structure of any one pixel disposed in the UDC area (e.g., the first area A1) shown in FIG. 13.

The display shown in FIG. 17 may be similar at least in part to the display shown in FIG. 16 or include various embodiments. In the following description, only different components in FIG. 17 will be described, and unexplained features will be replaced with the description of FIG. 16.

According to the embodiment shown in FIG. 17, at least one layer of the lower transparent electrode 1621 and the upper transparent electrode 1623 of the anode 1620 formed in the first are A1 may extend toward the pixel definition layer 1640 and form the transparent light-emitting portions 1301, 1302, and 1303 described with reference to FIG. 13.

The display shown in FIG. 17 may have a structure for compensating for a step difference formed as only some electrode layers (e.g., the lower transparent electrode 1621 and/or the upper transparent electrode 1623) extend outward among the plurality of electrode layers including the anode 1620. For example, in order for the organic layer 1630 to compensate for such a step difference in the display, a thickness 1711 of the first portion 1631 and a thickness 1712 of the second portion 1632 may be formed differently. For example, the organic layer 1630 may be formed such that the thickness 1712 of the second portion 1632 is greater than the thickness 1711 of the first portion 1631. Therefore, in the organic layer 1630, the upper surface of the first portion 1631 and the upper surface of the second portion 1632 may have substantially the same height.

Figure 18:
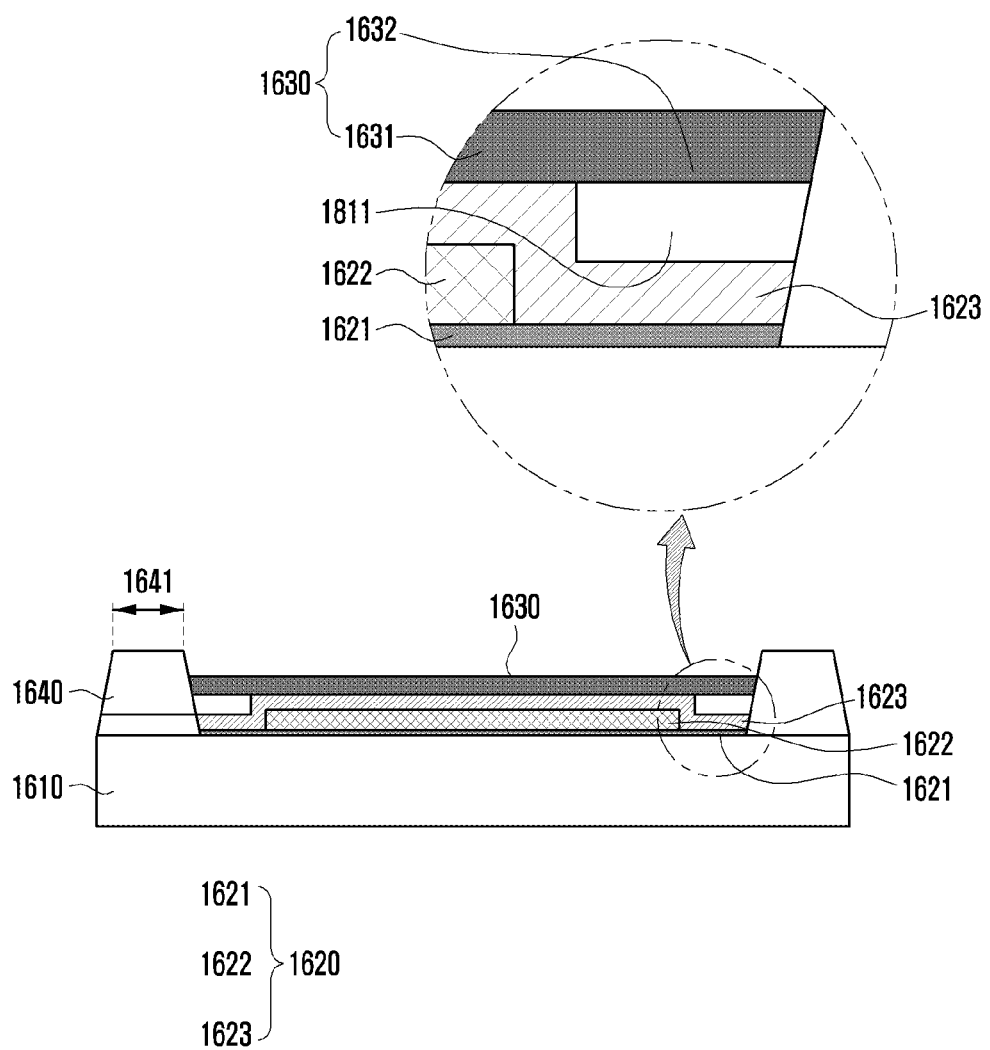
FIG. 18 is a cross-sectional view illustrating a stacked structure of a pixel disposed in a UDC area (e.g., a first area) of a display according to various embodiments.

FIG. 18 is a cross-sectional view illustrating a stacked structure of a pixel disposed in a UDC area (e.g., a first area A1) of a display according to various embodiments. For example, FIG. 18 may be a cross-sectional view illustrating a stacked structure of any one pixel disposed in the UDC area (e.g., the first area A1) shown in FIG. 13.

The display shown in FIG. 18 may be similar at least in part to the display shown in FIG. 16 or include various embodiments. In the following description, only different components in FIG. 18 will be described, and unexplained features will be replaced with the description of FIG. 16.

The display (e.g., the display 400 in FIG. 4) shown in FIG. 18 may have a structure for compensating for a step difference formed as only some electrode layers (e.g., the lower transparent electrode 1621 and/or the upper transparent electrode 1623) extend outward among the plurality of electrode layers 1621, 1622, and 1623 including the anode 1620. For example, the display of this embodiment may further include a buffer layer 1811, and the buffer layer 1811 may be disposed to compensate for such a step difference. For example, the buffer layer 1811 may be formed in an outer region of the anode 1620 adjacent to the pixel definition layer 1640. As the buffer layer 1811 is formed, the upper surface of the first portion 1631 and the upper surface of the second portion 1632 in the organic layer 1630 may have substantially the same height.

The display according to various embodiments may have a viewing angle control structure for differently designing a viewing angle of the first area A1 and a viewing angle of the second area A2. The viewing angle control structure may include a method using a refraction control film 1970 formed on the OLED and/or a method using a shape change of the anode 1920 in the first area A1. The display having the viewing angle control structure can reduce a phenomenon in which a grid-shaped structure is visually recognized by a user in the first area A1. Hereinafter, the display further including the viewing angle control structures according to various embodiments will be described with reference to FIGS. 19 to 22.

Figure 19:
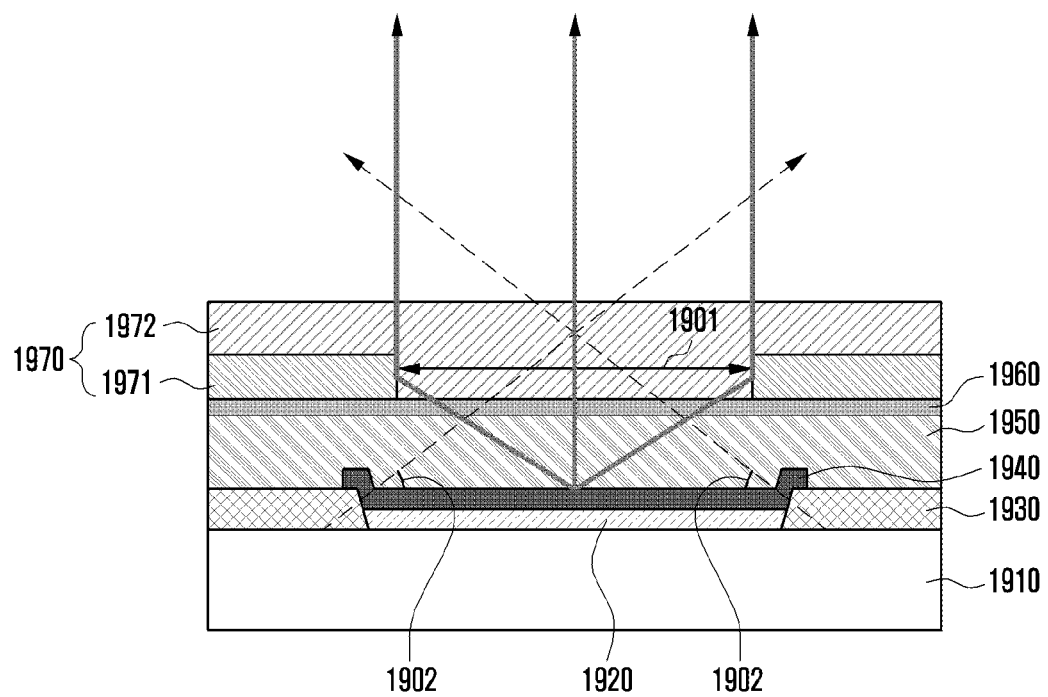
FIG. 19 is a cross-sectional view illustrating a viewing angle design structure of a pixel disposed in a normal area (e.g., a second area) of a display according to various embodiments.
Figure 20:
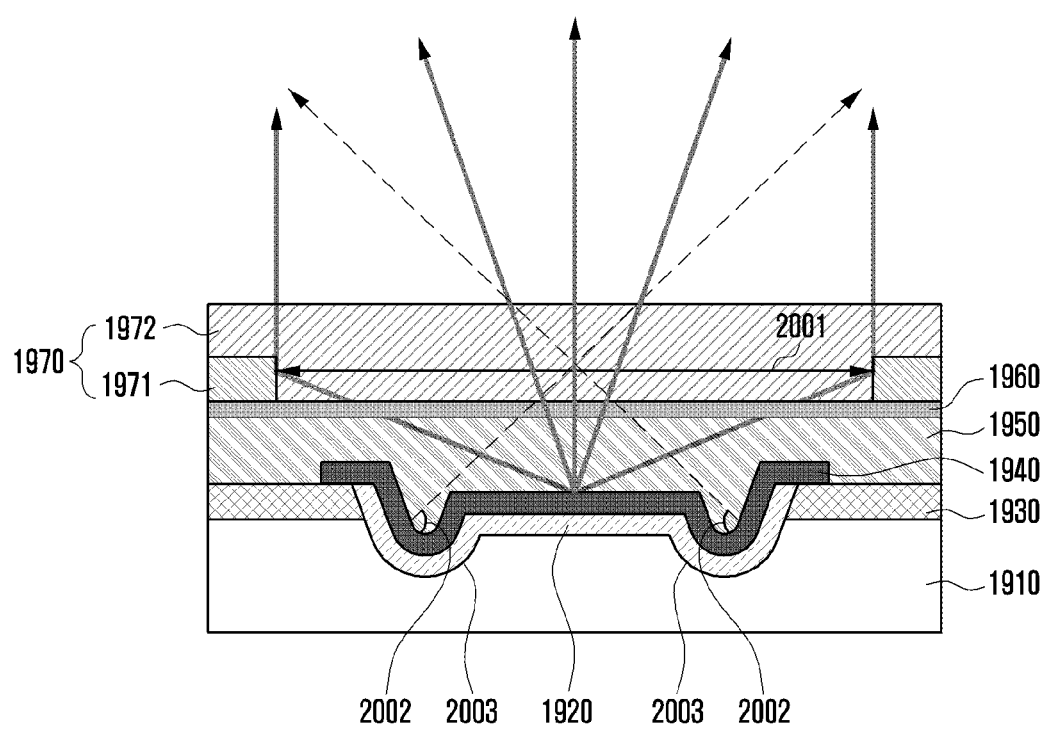
FIG. 20 is a cross-sectional view illustrating a viewing angle design structure of a pixel disposed in a UDC area (e.g., a first area) of a display according to various embodiments.

FIG. 19 is a cross-sectional view illustrating a viewing angle design structure of a pixel disposed in a normal area (e.g., a second area A2) of a display according to various embodiments. For example, FIG. 19 may be a cross-sectional view illustrating a stacked structure of any one pixel disposed in the normal area (e.g., the second area A2) shown in FIG. 13. FIG. 20 is a cross-sectional view illustrating a viewing angle design structure of a pixel disposed in a UDC area (e.g., a first area) of a display according to an embodiment. For example, FIG. 20 may be a cross-sectional view illustrating a stacked structure of any one pixel disposed in the UDC area (e.g., the first area A1) shown in FIG. 13.

With reference to FIG. 19, the second pixel 541 disposed in the second area A2 of the display (e.g., the display 400 in FIG. 4) according to an embodiment includes an OLED, and the OLED may include an anode 1920, an organic layer 1940 stacked on the anode 1920, and a cathode (not shown) stacked on the organic layer 1940. The anode 1920 and the organic layer 1940 may be formed on an insulating layer 1910 (e.g., the substrate 511 in FIG. 5). According to an embodiment, the anode 1920 and the organic layer 1940 may be partitioned by a pixel definition layer (PDL) 1930. For example, the pixel definition layer 1930 may form a boundary between adjacent subpixels.

According to an embodiment, encapsulation layers 1950 and 1960 may be formed on the OLED including the anode 1920 and the organic layer 1940. The encapsulation layers 1950 and 1960 may include an organic encapsulation layer 1950 (e.g., the organic encapsulation layer 550 in FIG. 5, thin film encapsulation (TFE)) made of an organic material, or an inorganic encapsulation layer 1960 made of an inorganic material. According to an embodiment, a refraction control film 1970 may be formed on the encapsulation layers 1950 and 1960. The refraction control film 1970 may include a touch sensor layer 1971 (e.g., the touch panel 432 in FIG. 4) having passivation (e.g., YPVX) for a touch electrode, and a micro light control pattern (MLP) structure 1972 (e.g., a material or light path control film having a certain transmittance and thickness between the OLED and the polarization layer).

According to an embodiment, the refraction control film 1970 may control the refractive index of light by adjusting a gap of the passivation (e.g., YPVX) for the touch electrode in the touch sensor layer 1971. For example, in the second area A2, the touch sensor layer 1971 may have an opening that overlaps with at least a portion of the anode 1920 and has a fifth width 1901 through gap adjustment of the passivation for the touch electrode.

According to an embodiment, in the second area A2, the MLP structure 1972 of the refraction control film 1970 may be formed of a high refractive index film and may have, for example, a higher refractive index (e.g., about a refractive index of 1.6) than a refractive index (e.g., about a refractive index of about 1.5) of the opening of the passivation (e.g., YPVX) for the touch electrode. The MLP structure 1972 may include a plurality of layers (not shown) having different refractive indices and may have a structure in which an optical path is changed using a difference in refractive index between materials including the plurality of layers.

The second area A2 according to an embodiment may have a first viewing angle 1902 that is relatively narrower than that of the first area A1 through refractive index control using the refraction control film 1970.

With reference to FIG. 20, the first area A1 of the display according to an embodiment may include the refraction control film 1970, and the refraction control film 1970 may include the touch sensor layer 1971 (e.g., the touch panel 432 in FIG. 4) having the passivation (e.g., YPVX) for the touch electrode, and the MLP structure 1972 (e.g., a material or light path control film having a certain transmittance and thickness between the OLED and the polarization layer).

According to an embodiment, the refraction control film 1970 may control the refractive index of light by adjusting a gap of the passivation (e.g., YPVX) for the touch electrode in the touch sensor layer 1971. For example, in the first area A1, the touch sensor layer 1971 may have an opening having a sixth width 2001 through gap adjustment of the passivation for the touch electrode. The sixth width 2001 may be greater than the fifth width 1901 described with reference to FIG. 19.

According to an embodiment, in the first area A1, the MLP structure 1972 of the refraction control film 1970 may be formed of a low refractive index film and may have, for example, a lower refractive index than a refractive index (e.g., about a refractive index of about 1.5) of the opening of the passivation (e.g., YPVX) for the touch electrode.

According to an embodiment, the anode 1920 in the first area A1 may have at least one curved surface, unlike the anode 1920 in the second area A2 having a flat film shape. For example, as shown in FIG. 20, the anode 1920 of the first area A1 may have a concave portion 2003 at the periphery of the anode 1920 adjacent to the pixel definition layer (PDL) 1930. For example, the surface of the concave portion 2003 may have a concave curved surface and be connected to a side surface of the pixel definition layer 1930. According to an embodiment, the height of the surface of the concave portion 2003 may be lower than that of the central region of the anode 1920.

The first area A1 of the display according to various embodiments may have a second viewing angle 2002, which is a relatively wide viewing angle than the second area A2, through a change in the design of the refraction control film 1970 and a change in the shape of the anode 1920 of the first area A1.

Figure 21:
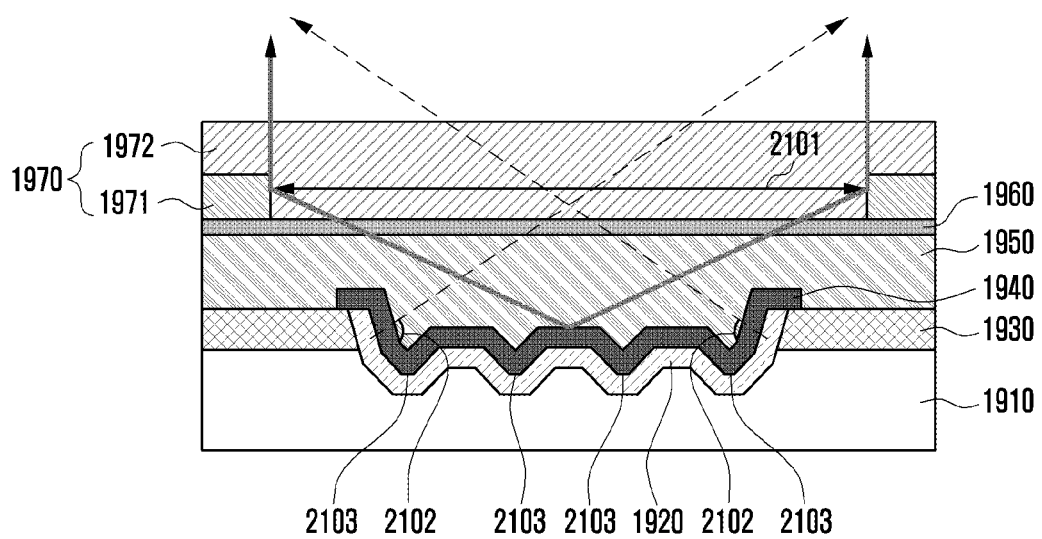
FIG. 21 is a cross-sectional view illustrating a viewing angle design structure of a pixel disposed in a UDC area (e.g., a first area) of a display according to various embodiments.
Figure 22:
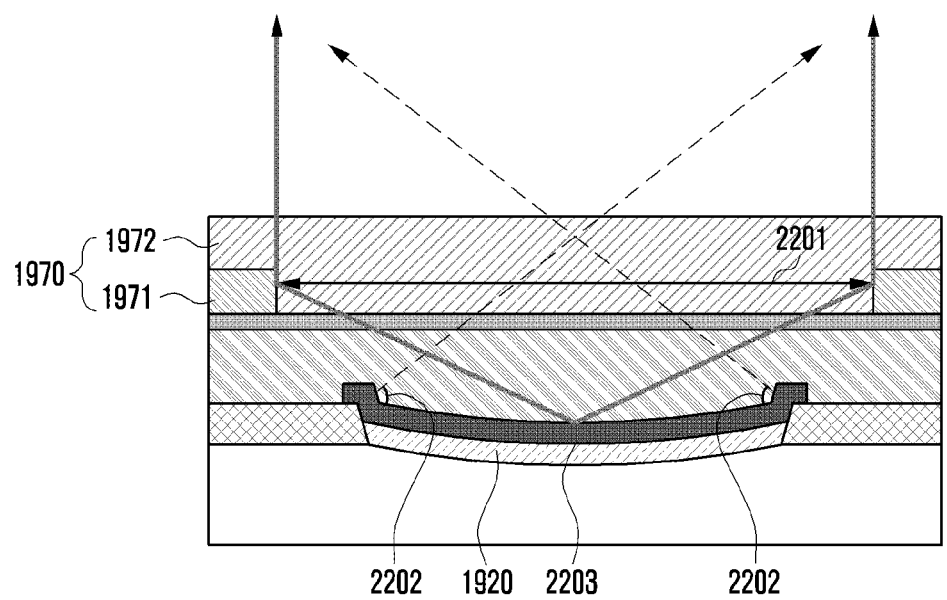
FIG. 22 is a cross-sectional view illustrating a viewing angle design structure of a pixel disposed in a UDC area (e.g., a first area) of a display according to various embodiments.

According to various embodiments, the shape of the concave portion 2003 may be variously changed or modified as shown in FIGS. 21 and 22. According to various embodiments, the shape of the concave portion 2003 may not be limited to the shapes shown in FIGS. 20, 21 and 22.

FIG. 21 is a cross-sectional view illustrating a viewing angle design structure of a pixel disposed in a UDC area (e.g., a first area A1) of a display according to various embodiments. FIG. 22 is a cross-sectional view schematically a viewing angle design structure of a pixel disposed in a UDC area (e.g., a first area A1) of a display according to various embodiments. For example, FIGS. 21 and 22 may be cross-sectional views illustrating a stacked structure of any one pixel disposed in the UDC area (e.g., the first area A1) shown in FIG. 13.

The displays shown in FIGS. 21 and 22 may be similar at least in part to the display shown in FIG. 20 or include various embodiments. In the following description, only different components in FIGS. 21 and 22 will be described, and unexplained features will be replaced with the description of FIG. 20.

With reference to FIG. 21, the anode 1920 in the first area A1 may have a curved surface including a plurality of irregularities 2103, unlike the anode 1920 in the second area A2 having a flat film shape. For example, as shown in FIG. 21, the anode 1920 of the first area A1 may have the curved surface including the plurality of irregularities 2103 over the entire area between the pixel definition layers (PDL) 1930. The first area A1 of the display according to this embodiment may have a third viewing angle 2102, which is a relatively wide viewing angle than the second area A2, through a change in the design of the refraction control film 1970 and a change in the shape of the anode 1920 of the first area A1.

Reference numeral "2101" in FIG. 21 denotes a gap of passivation (e.g., YPVX) for a touch electrode, and this gap may be greater than the fifth width 1901 described with reference to FIG. 19.

With reference to FIG. 22, the anode 1920 in the first area A1 may have a single curved surface 2203 whose height decreases toward the center of the anode 1920, unlike the anode 1920 in the second area A2 having a flat film shape. For example, as shown in FIG. 22, the anode 1920 of the first area A1 may have the highest height in a portion adjacent to the pixel definition layer (PDL) 1930 and have the lowest height in a central portion of the anode 1920. The first area A1 of the display according to this embodiment may have a fourth viewing angle 2202, which is a relatively wide viewing angle than the second area A2, through a change in the design of the refraction control film 1970 and a change in the shape of the anode 1920 of the first area A1.

Reference numeral "2201" in FIG. 22 denotes a gap of passivation (e.g., YPVX) for a touch electrode, and this gap may be greater than the fifth width 1901 described with reference to FIG. 19.

According to various embodiments, in the first area A1, the driving circuit (e.g., the driving TFT) for driving the first pixel 542 is not disposed, and the first pixel 542 and a plurality of transparent wires electrically connected to the first pixel 542 may be disposed. According to an embodiment, when the driving circuit for driving the first pixel 542 is not disposed in the first area A1, the first pixel 542 disposed in the first area A1 may be driven by a driving circuit disposed in the second area A2. According to an embodiment, when the driving circuit for driving the first pixel 542 is not disposed in the first area A1, the first pixel 542 disposed in the first area A1 may be driven by a driving circuit (not shown) disposed between the first area A1 and the second area A2. According to an embodiment, when the driving circuit for driving the first pixel 542 is not disposed in the first area A1, the pixels disposed in the first area A1 may be driven by a driving circuit (not shown) disposed in the second area A2 to drive the pixels disposed in the second area A2. In this case, one driving circuit (not shown) disposed in the second area A2 not only drives the second pixel 541 disposed in the second area A2, but also drives the first pixel 542 disposed in the first area A1. For example, when a red pixel (not shown) and a driving circuit (not shown) for driving the red pixel are disposed in the second area A2, the driving circuit is capable of driving the red pixel (not shown) in the first area A1 as well as the red pixel in the second area A2.

According to various example embodiments, an electronic device (e.g., the electronic device 100 in FIG. 1) includes: a housing (e.g., the housing 110 in FIG. 1), a display (e.g., the display 101 in FIG. 1), and a camera (e.g., the first camera 105 in FIG. 1) disposed inside the housing 110 overlapping a portion of the display 101 and configured to acquire light passing through the display 101 from outside. The display 101 may include a first area (e.g., the first area A1 in FIG. 5) in which a first pixel (e.g., the first pixel 542 in FIG. 5) overlapping with at least a portion of the camera 105 and a first pixel driving circuit (e.g., the first pixel driving circuit 800 in FIG. 8) configured to drive the first pixel 542 are disposed, and a second area (e.g., the second area A2 in FIG. 5), other than the first area A1, in which a second pixel (e.g., the second pixel 541 in FIG. 5) and a second pixel driving circuit (e.g., the second pixel driving circuit 700 in FIG. 7) configured to drive the second pixel 541 are disposed. The first pixel driving circuit 800 may include a first driving thin film transistor (TFT) (e.g., the first driving TFT (DT1) in FIG. 8) having a first channel region of a straight shape that does not include a curved shape, and the second pixel driving circuit 700 may include a second driving TFT (e.g., the second driving TFT (DT2) in FIG. 7) having a second channel region of a curved shape. A first channel width of the first driving TFT (DT1) may be greater than a second channel width of the second driving TFT (DT2), and a first channel length of the first driving TFT (DT1) may be less than a second channel length of the second driving TFT (DT2).

According to an example embodiment, the first area A1 may include a cluster area (e.g., the cluster area CA in FIG. 9) in which the first pixel 542 and the first pixel driving circuit 800 are disposed to overlap with each other, a wiring area (e.g., the wiring area SA in FIG. 9) connecting the cluster areas CA adjacent to each other and in which at least one signal wire is disposed, and a transmission area (e.g., the transmission area TA in FIG. 9) other than the cluster area CA and the wiring area SA. At least a portion of the first pixel 542 may extend partly into the wiring area SA.

According to an example embodiment, the first pixel 542 may include a first subpixel (e.g., the first subpixel R1 in FIG. 9), a second subpixel (e.g., the second subpixel G1 in FIG. 9), and a third subpixel (e.g., the third subpixel B1 in FIG. 9), wherein the first subpixel R1, the second subpixel G1, and the third subpixel B1 may be arranged to form one group in the one cluster area CA. Each of the first subpixel R1, the second subpixel G1, and the third subpixel B1 may have an extension extending from the one cluster area CA to a portion of the wiring area SA.

According to an example embodiment, the first subpixel R1 may have a first extension 911 extending to a portion of the wiring area SA adjacent to the first subpixel R1, the second subpixel G1 may have a second extension 912 extending to a portion of the wiring area SA adjacent to the second subpixel G1, and the third subpixel B1 may have a third extension 913 extending to a portion of the wiring area SA adjacent to the third subpixel B1.

According to an example embodiment, the first extension 911 may include a first anode and a first organic layer formed to extend from a portion of the cluster area CA to a portion of the wiring area SA, the second extension 912 may include a second anode and a second organic layer formed to extend from a portion of the cluster area CA to a portion of the wiring area SA, and the third extension 913 may include a third anode and a third organic layer formed to extend from a portion of the cluster area CA to a portion of the wiring area SA.

According to an example embodiment, the first extension 911 may have a first length, the second extension 912 may have a second length, and the third extension 913 may have a third length. The first length, the second length, and the third length may be all equal to each other.

According to an example embodiment, the first extension 911 may have a first length, the second extension 912 may have a second length, and the third extension 913 may have a third length. The first length, the second length, and the third length may be different from each other.

According to an example embodiment, the wiring area SA may have a first width in a portion where the extension is not formed, and have a second width greater than the first width in a portion where the extension is formed.

According to an example embodiment, the wiring area SA may have a constant width in a portion where the extension is not formed and a portion where the extension is formed.

According to an example embodiment, the first pixel 542 may include an organic light emitting diodes (OLED) including an anode, an organic layer stacked on the anode, and a cathode stacked on the anode. The anode may have a structure in which at least one transparent electrode and at least one opaque electrode are stacked, and the OLED may include a transparent light-emitting portion formed by a portion of the transparent electrode and a portion of the organic layer, which extend to a portion of the transmission area TA.

According to an example embodiment, the anode may include a lower transparent electrode formed on an insulating layer, an opaque electrode formed on the lower transparent electrode, and an upper transparent electrode formed on the opaque electrode.

According to an example embodiment, the transparent light-emitting portion of the OELD may include a portion of the lower transparent electrode extending to a portion of the transmission area TA and a portion of the organic layer covering the extending portion of the lower transparent electrode.

According to an example embodiment, the transparent light-emitting portion of the OELD may include a portion of the upper transparent electrode extending to a portion of the transmission area TA and a portion of the organic layer covering the extending portion of the upper transparent electrode.

According to an example embodiment, the transparent light-emitting portion of the OELD may include a portion of the lower and upper transparent electrodes extending to a portion of the transmission area TA and a portion of the organic layer covering the extending portion of the upper transparent electrode.

According to an example embodiment, the organic layer may include a first portion overlapping with at least a portion of the opaque electrode to correspond to the cluster area CA, and a second portion overlapping with the transparent electrode in the transparent light-emitting portion outside the first portion.

According to an example embodiment, the first portion of the organic layer may have a first thickness, and the second portion of the organic layer may have a second thickness greater than the first thickness configured to compensate for a height step difference between the first portion and the second portion.

According to an example embodiment, the first pixel 542 may include a transparent buffer layer formed between the second portion and the transparent electrode configured to compensate for a height step difference between the first portion and the second portion.

According to an example embodiment, a refraction control film may be disposed on the OELD. In the first area A1, the refraction control film may be formed to have a designated first refractive index, and in the second area A2, the refraction control film may be formed to have a designated second refractive index higher than the first refractive index.

According to an example embodiment, in the second area A2, the refraction control film may have an opening having a designated third width, and in the first area A1, the refraction control film may have an opening having a designated fourth width greater than the third width.

According to an example embodiment, in the first area A1, the anode of the OLED may have at least one curved surface.

The various example embodiments disclosed in the disclosure and drawings are merely presented as specific examples to easily explain the technical contents of the disclosure and aid in the understanding of the disclosure, and is not intended to limit the scope of the disclosure. Accordingly, it should be understood that changes or modifications derived from the subject matter of the disclosure are included in the scope of various embodiments of the disclosure. It will also be understood that any of the embodiment(s) described herein may be used in conjunction with any other embodiment(s) described herein.

What is claimed is:

1. An electronic device comprising:
a housing;
a display; and
a camera disposed inside the housing overlapping with a portion of the display and configured to acquire light passing through the display from outside,
wherein the display includes:
a first area in which a first pixel overlapping with at least a portion of the camera and a first pixel driving circuit configured to drive the first pixel are disposed, and
a second area, other than the first area, in which a second pixel and a second pixel driving circuit configured to drive the second pixel are disposed,
wherein the first pixel driving circuit includes a first driving thin film transistor (TFT) having a first channel region having a straight shape that does not include a curved shape,
wherein the second pixel driving circuit includes a second driving TFT having a second channel region having a curved shape,
wherein a first channel width of the first driving TFT is greater than a second channel width of the second driving TFT,
wherein a first channel length of the first driving TFT is less than a second channel length of the second driving TFT, and
wherein the first channel width and the first channel length of the first driving TFT generate a greater driving current delivered by the first driving TFT relative to the second driving TFT to increase a luminance of the first pixel.

2. The electronic device of claim 1, wherein the first area includes:
a cluster area in which the first pixel and the first pixel driving circuit are disposed to overlap with other;
a wiring area connecting the cluster areas adjacent to each other and in which at least one signal wire is disposed; and
a transmission area other than the cluster area and the wiring area, and
wherein at least a portion of the first pixel extends partly into the wiring area.

3. The electronic device of claim 2, wherein the first pixel includes a first subpixel, a second subpixel, and a third subpixel,
wherein the first subpixel, the second subpixel, and the third subpixel are arranged to form one group in the one cluster area, and
wherein each of the first subpixel, the second subpixel, and the third subpixel include an extension extending from the one cluster area to a portion of the wiring area.

4. The electronic device of claim 3, wherein the first subpixel includes a first extension extending to a portion of the wiring area adjacent to the first subpixel,
wherein the second subpixel includes a second extension extending to a portion of the wiring area adjacent to the second subpixel, and
wherein the third subpixel includes a third extension extending to a portion of the wiring area adjacent to the third subpixel.

5. The electronic device of claim 4, wherein the first extension includes a first anode and a first organic layer extending from a portion of the cluster area to a portion of the wiring area,
wherein the second extension includes a second anode and a second organic layer extending from a portion of the cluster area to a portion of the wiring area, and
wherein the third extension includes a third anode and a third organic layer extending from a portion of the cluster area to a portion of the wiring area.

6. The electronic device of claim 4, wherein the first extension has a first length, the second extension has a second length, and the third extension has a third length, and
wherein the first length, the second length, and the third length are all equal to each other.

7. The electronic device of claim 4, wherein the first extension has a first length, the second extension has a second length, and the third extension has a third length, and
wherein the first length, the second length, and the third length are different from each other.

8. The electronic device of claim 3, wherein the wiring area has a first width in a portion where the extension is not formed, and has a second width greater than the first width in a portion where the extension is formed.

9. The electronic device of claim 3, wherein the wiring area has a constant width in a portion where the extension is not formed and a portion where the extension is formed.

10. The electronic device of claim 2, wherein the first pixel includes an organic light emitting diodes (OLED) including an anode, an organic layer stacked on the anode, and a cathode stacked on the anode, wherein the anode includes at least one transparent electrode and at least one opaque electrode that are stacked, and wherein the OLED includes a transparent light-emitting portion formed by a portion of the transparent electrode and a portion of the organic layer, extending to a portion of the transmission area.

11. The electronic device of claim 10, wherein the anode includes a lower transparent electrode formed on an insulating layer, an opaque electrode formed on the lower transparent electrode, and an upper transparent electrode formed on the opaque electrode.

12. The electronic device of claim 11, wherein the transparent light-emitting portion of the OLED includes a portion of the lower transparent electrode extending to a portion of the transmission area and a portion of the organic layer covering the extending portion of the lower transparent electrode.

13. The electronic device of claim 11, wherein the transparent light-emitting portion of the OLED includes a portion of the upper transparent electrode extending to a portion of the transmission area and a portion of the organic layer covering the extending portion of the upper transparent electrode.

14. The electronic device of claim 11, wherein the transparent light-emitting portion of the OLED includes a portion of the lower and upper transparent electrodes extending to a portion of the transmission area and a portion of the organic layer covering the extending portion of the upper transparent electrode.

15. The electronic device of claim 10, wherein the organic layer includes:

a first portion overlapping at least a portion of the opaque electrode corresponding to the cluster area; and a second portion overlapping with the transparent electrode in the transparent light-emitting portion outside the first portion.

16. The electronic device of claim 15, wherein the first portion of the organic layer has a first thickness, and the second portion of the organic layer has a second thickness greater than the first thickness and is configured to compensate for a height step difference between the first portion and the second portion.

17. The electronic device of claim 15, wherein the first pixel includes a transparent buffer layer between the second portion and the transparent electrode configured to compensate for a height step difference between the first portion and the second portion.

18. The electronic device of claim 10, wherein a refraction control film is disposed on the OLED, wherein in the first area, the refraction control film has a designated first refractive index, and wherein in the second area, the refraction control film has a designated second refractive index higher than the first refractive index.

19. The electronic device of claim 18, wherein in the second area, the refraction control film has an opening having a designated third width, and wherein in the first area, the refraction control film has an opening having a designated fourth width greater than the third width.

20. The electronic device of claim 10, wherein in the first area, the anode of the OLED has at least one curved surface.

* * * * *